United States Patent
Lee et al.

(10) Patent No.: US 9,306,139 B2
(45) Date of Patent: Apr. 5, 2016

(54) LIGHT EMITTING DEVICE, METHOD OF FABRICATING THE SAME AND LIGHTING SYSTEM

(71) Applicant: LG INNOTEK CO., LTD., Seoul (KR)

(72) Inventors: Kwang Hee Lee, Seoul (KR); Gam Gon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/891,051

(22) Filed: May 9, 2013

(65) Prior Publication Data

US 2013/0299854 A1      Nov. 14, 2013

(30) Foreign Application Priority Data

May 14, 2012   (KR) .................. 10-2012-0050963

(51) Int. Cl.
*H01L 33/48* (2010.01)
*H01L 33/62* (2010.01)

(52) U.S. Cl.
CPC .............. *H01L 33/62* (2013.01); *H01L 33/486* (2013.01); *H01L 2224/32245* (2013.01); *H01L 2224/48091* (2013.01); *H01L 2224/48247* (2013.01); *H01L 2224/49113* (2013.01); *H01L 2224/73265* (2013.01); *H01L 2224/92247* (2013.01); *H01L 2924/1301* (2013.01)

(58) Field of Classification Search
CPC ......... H01L 33/62; H01L 33/48; H01L 33/52; H01L 33/54
USPC ............................ 257/88, 81–82, 99; 362/235
See application file for complete search history.

(56) References Cited

U.S. PATENT DOCUMENTS

| | | | |
|---|---|---|---|
| 2005/0280017 A1 | 12/2005 | Oshio et al. | 257/99 |
| 2006/0065957 A1 | 3/2006 | Hanya | 257/676 |
| 2008/0258171 A1 | 10/2008 | Tsukagoshi | |
| 2010/0133554 A1 | 6/2010 | Hussell | |

(Continued)

FOREIGN PATENT DOCUMENTS

| | | |
|---|---|---|
| JP | 2005-353914 | 12/2005 |
| JP | 2006-041380 A | 2/2006 |

(Continued)

OTHER PUBLICATIONS

Japanese Office Action issued in related Application No. 2013-100038 dated Oct. 22, 2014.

(Continued)

*Primary Examiner* — Matthew Reames
*Assistant Examiner* — Vincent Wall
(74) *Attorney, Agent, or Firm* — Ked & Associates, LLP

(57) ABSTRACT

A light emitting device according to an embodiment includes a body including first and second side walls which correspond to each other, third and fourth side walls which have lengths longer than lengths of the first and second side walls, and a concave portion; a first lead frame under the concave portion and the third side wall; a second lead frame under the concave portion and the fourth side wall; a light emitting chip on at least one of the first and second lead frames; a molding member on the concave portion; a first recess portion recessed from the first side wall toward the second side wall and connected to a bottom of the body; and a second recess portion recessed from the second side wall toward the first side wall and connected to the bottom of the body.

21 Claims, 20 Drawing Sheets

(56) References Cited

U.S. PATENT DOCUMENTS

| | | | |
|---|---|---|---|
| 2010/0270571 A1* | 10/2010 | Seo ................................ 257/98 |
| 2010/0314635 A1* | 12/2010 | Brunner et al. ................. 257/88 |
| 2011/0215349 A1 | 9/2011 | An et al. .......................... 257/89 |
| 2011/0220927 A1 | 9/2011 | Min |
| 2012/0025361 A1 | 2/2012 | Ito et al. ........................ 257/676 |
| 2012/0127720 A1 | 5/2012 | Hussell et al. |
| 2012/0161180 A1* | 6/2012 | Komatsu et al. ................. 257/98 |
| 2012/0223343 A1* | 9/2012 | Kang et al. ...................... 257/88 |
| 2012/0313122 A1* | 12/2012 | Nakayama .......... H01L 25/0753 257/88 |
| 2012/0326183 A1* | 12/2012 | Min ....................... H01L 25/13 257/88 |
| 2013/0056788 A1 | 3/2013 | Haraguchi et al. .............. 257/99 |
| 2014/0117403 A1* | 5/2014 | Hayashi ................. H01L 33/62 257/99 |

FOREIGN PATENT DOCUMENTS

| | | |
|---|---|---|
| JP | 2006-93435 A | 4/2006 |
| JP | 2008-288275 A | 11/2008 |
| JP | 2010-235756 A | 10/2010 |
| JP | 2011-003811 | 1/2011 |
| JP | 2011-249807 A | 12/2011 |
| JP | 2012-28699 A | 2/2012 |
| WO | WO 2011/136302 A1 | 11/2011 |
| WO | 2012/050994 A2 | 4/2012 |

OTHER PUBLICATIONS

Japanese Office Action dated Apr. 17, 2014 issued in Application No. 2013-100038.

European Search Report dated Dec. 2, 2015 issued in Application No. 13167635.5.

* cited by examiner

LIGHT EMITTING DEVICE, METHOD OF FABRICATING THE SAME AND LIGHTING SYSTEM

The present application claims priority under 35 U.S.C. §119(a) of Korean Patent Application No. 10-2012-0050963 filed on May 14, 2012, which is hereby incorporated by reference in its entirety.

BACKGROUND

The embodiment relates to a light emitting device, a method of fabricating the same and a lighting system.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by using ultraviolet ray, which is generated through the high-voltage discharge.

In addition, the LED generates the light by using the potential gap of the semiconductor device, so the LED is advantageous as compared with conventional light sources in terms of life span, response characteristics, and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

An embodiment provides a light emitting device including a body having a side wall of a novel structure.

The embodiment provides a light emitting device including a recess portion in at least one of side walls of a body.

The embodiment provides a light emitting device including a plurality of recess portions in a bottom of a body.

The embodiment provides a light emitting device including a plurality of recess portions in the first and second side walls of side walls which correspond to each other.

The embodiment provides a light emitting device including recess portions in the first and second side walls corresponding to a side surface of a cavity in which a light emitting chip is disposed.

The embodiment provides a method of fabricating a light emitting device which can support a body by using a hanger inserted into a recess portion when the body is injection-molded.

According to the embodiment, there is provided a light emitting device including a body including first and second side walls which correspond to each other, third and fourth side walls which have lengths longer than lengths of the first and second side walls, and a concave portion therein; a first lead frame under the concave portion and the third side wall; a second lead frame under the concave portion and the fourth side wall; a light emitting chip on at least one of the first and second lead frames; a molding member on the concave portion; a first recess portion recessed from the first side wall toward the second side wall and connected to a bottom of the body; and a second recess portion recessed from the second side wall toward the first side wall and connected to the bottom of the body.

According to the embodiment, there is provided a light emitting device including a body including first and second side walls which correspond to each other, third and fourth side walls which have lengths longer than lengths of the first and second side walls, and a concave portion therein; a first lead frame under the concave portion; a second lead frame under the concave portion; a first light emitting chip on the first lead frame; a second light emitting chip on the second lead frame; a molding member on the concave portion; a plurality of first recess portions recessed from the first side wall toward the second side wall; and a plurality of second recess portions recessed from the second side wall toward the first side wall, wherein the first recess portions are spaced apart from each by a gap larger than a gap between the first and second light emitting chips.

DETAILED DESCRIPTION OF THE EMBODIMENTS

Figure 1:
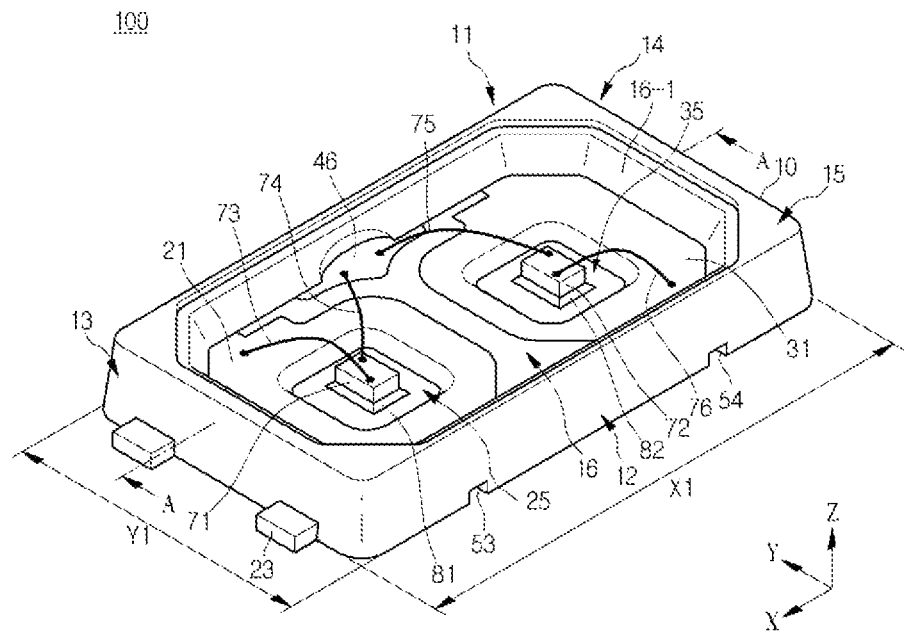
FIG. 1 is a perspective view showing a light emitting device according to a first embodiment.

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Hereinafter, a light emitting device according to the embodiment will be described with reference to the accompanying drawings. Reference numbers are applicable to multiple figures to explain embodiments of the subject application.

Figure 2:
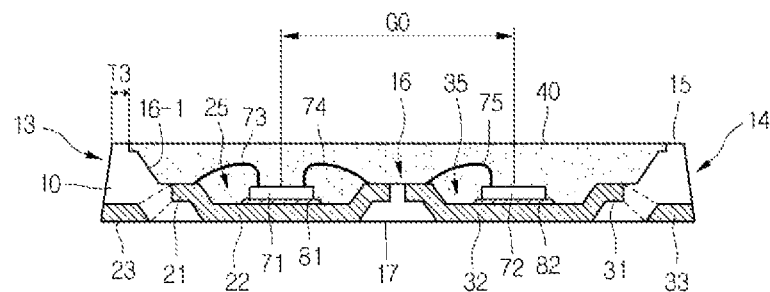
FIG. 2 is a sectional view taken along line A-A of the light emitting device in FIG. 1.
Figure 3:
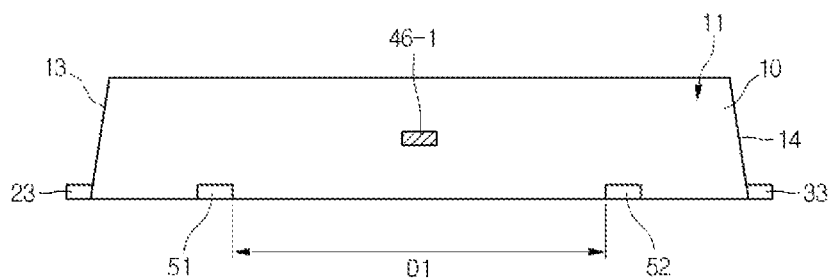
FIG. 3 is a view of the light emitting device in FIG. 1 when viewed from a first side.
Figure 4:
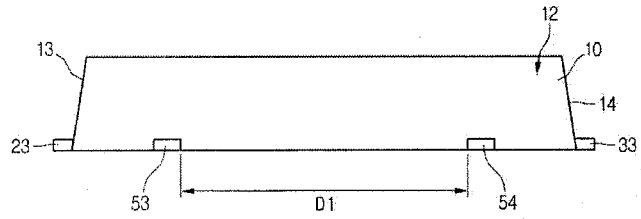
FIG. 4 is a view of the light emitting device in FIG. 1 when viewed from a second side.
Figure 5:
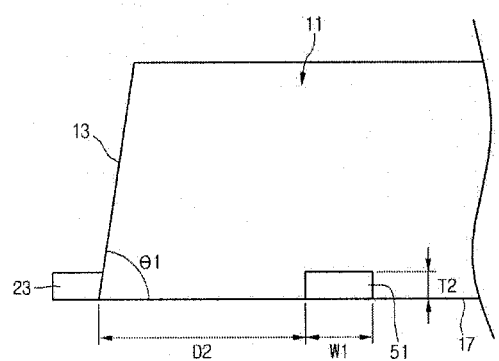
FIG. 5 is a partially enlarged view of FIG. 3.
Figure 6:
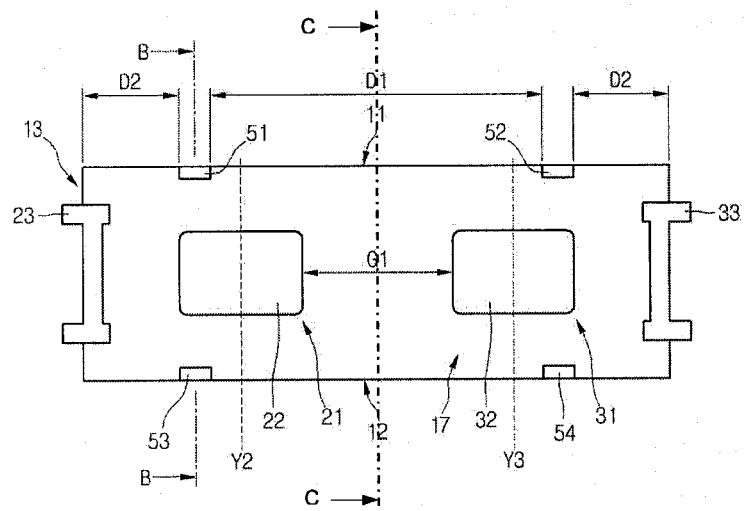
FIG. 6 is a rear view of the light emitting device of FIG. 1.
Figure 7:
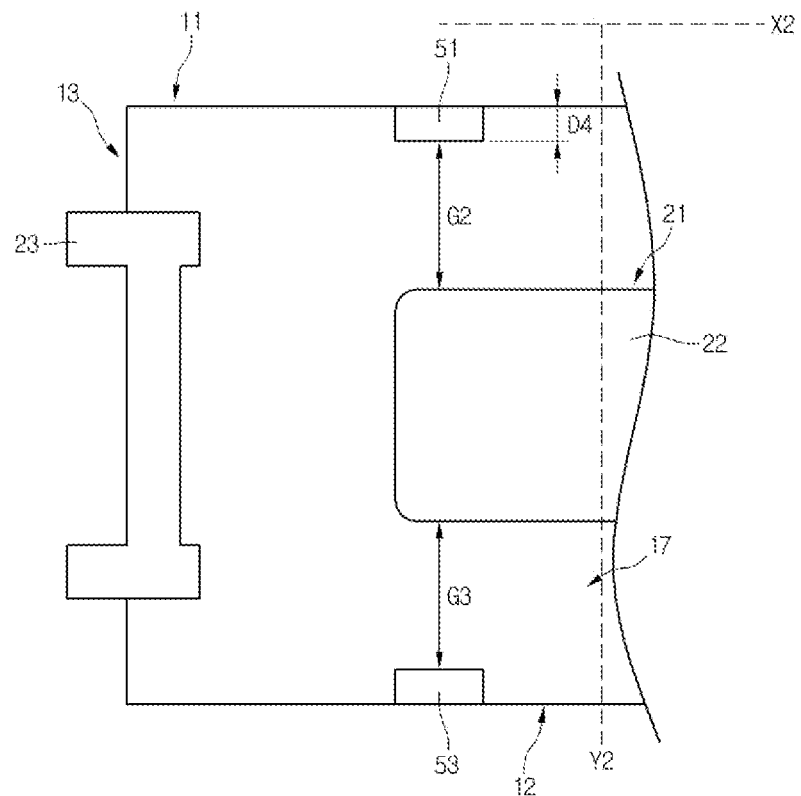
FIG. 7 is a partially enlarged view of FIG. 6.
Figure 8:
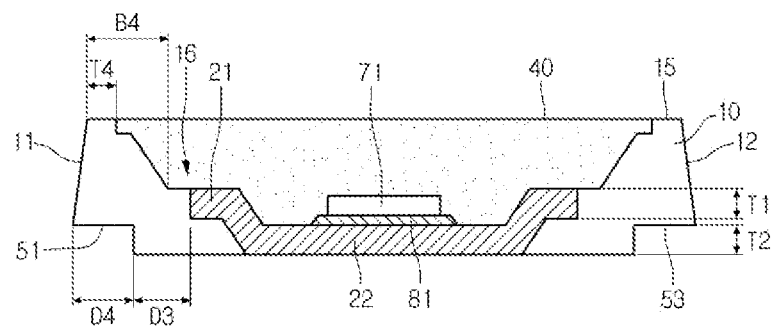
FIG. 8 is a sectional view taken along line B-B of the light emitting device in FIG. 6.
Figure 9:
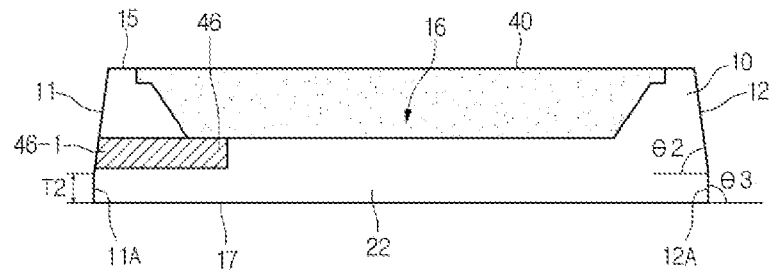
FIG. 9 is a sectional view at a central side of the light emitting device in FIG. 6.

FIG. 1 is a perspective view illustrating a light emitting device according to a first embodiment, FIG. 2 is a sectional view taken along line A-A of the light emitting device in shown FIG. 1, FIG. 3 is a view showing the light emitting device of FIG. 1 when seen from a first side, FIG. 4 is a view showing the light emitting device of FIG. 1 when seen from a second side, FIG. 5 is a partially enlarged view of the light emitting device shown in FIG. 3, FIG. 6 is a rear view showing the light emitting device of FIG. 1, FIG. 7 is a partially enlarged view of the light emitting device of FIG. 2, FIG. 8 is a sectional view taken along line B-B of the light emitting device in shown FIG. 6, and FIG. 9 is a sectional view of a central portion along line C-C of the light emitting device shown in FIG. 6.

Referring to FIGS. 1 to 9, the light emitting device 100 includes a body 10 having a concave portion 16, a first lead frame 21 having a first cavity 25 under the concave portion 16, a second lead frame 31 having a second cavity 35 under the concave portion 16, a molding member 40, a connecting frame 46, and light emitting chips 71 and 72. The connecting frame 46 may be omitted from the light emitting device 100.

The body 10 may include an insulating material, a non-metal material or a conductive material. The body 10 may include at least one of a resin material, such as Polyphthalamide (PPA), silicon or epoxy, a metallic material, photo sensitive glass (PSG), a ceramic material, sapphire ($Al_2O_3$), and a printed circuit board (PCB) having a circuit pattern. For example, the body 10 may include a resin material such as Polyphthalamide (PPA), silicon or epoxy. The body 10 may be formed of epoxy or silicon. A filler including metal oxide such as $TiO_2$ or $SiO_2$ may be added to the body 10 to increase reflecting efficiency.

The body 10 may have a polygonal outer appearance, such as a triangle shape, a rectangular shape or a square shape, a circular shape, or a shape having a curved surface, when viewed from the top.

The body 10 includes the concave portion 16 having a predetermined depth from the top surface of the body 10 and an opened upper portion, a side surface 16-1 of the concave portion 16 and a bottom. The concave portion 16 may be formed in various structures such as a cup structure, a cavity structure or a recess structure, but the embodiment is not limited thereto. The side surface 16-1 of the concave portion 16 may be perpendicular or inclined to the bottom of the body 10. The body 10 may have a polygonal outer appearance, such as a rectangular shape or a square shape, a circular shape, or a shape having a curved surface, when viewed from the top The concave portion 16 may have a circle shape, an ellipse shape, a polygon (for example, a square) shape, and a polygon shape having curved corners when viewed from the top.

The body 10 may include a plurality of side walls, for example, at least four side walls 11, 12, 13 and 14. The first to fourth side walls 11 to 14 will be described as one example. The first side wall 11 faces the second side wall 12, and the third side wall 13 faces the fourth side wall 14.

At least one of the side walls 11 to 14 may be disposed to be perpendicular to or inclined to the bottom of the body 10. For example, as shown in FIG. 5, the side walls 11 to 14 of the body 10 may be inclined at a first angle θ1 with respect to a segment perpendicular to the bottom 17 of the body 10, and the first angle θ1 may be in the range as shown in FIG. 5. Since the side walls 11 to 14 of the body 10 are inclined, when molding the body 10, a mold for molding the body 10 is easily separated from the body 10.

A length X1 of the first and second side walls 11 and 12 may be different from a length Y1 of the third and fourth side walls 13 and 14. For example, the length X1 of the first and second side walls 11 and 12 may be longer than the length Y1 of the third and fourth side walls 13 and 14. The length X1 of the first or second side wall 11 or 12 may be the gap between the third and fourth side walls 13 and 14. A direction of a first axis X which is a longitudinal direction of the body 10 passes through the centers of the second and third cavities 25 and 35 and the length X1 of the first or second side wall 11 or 12 may be the gap between the third and fourth side walls 13 and 14. A direction of a second axis Y which is the width direction of the body 10 may be a direction perpendicular to the first axis X, and may be the gap between the first and second side walls 11 and 12.

The length X1 of the first and second side walls 11 and 12 may be the length of the body 10 and the length Y1 of the third and fourth side walls 13 and 14 may be the width of the body 10.

The length X1 of the first and second side walls 11 and 12, which is the length of the body 10, is for example, two or three times longer than that Y1 of the third and fourth side walls 13 and 14 which is the width of the body 10. Since the length X1 of the body 10 is longer than the width Y1 of the body 10, a middle portion of the body 10 may be bent or damaged when performing an injection molding process. The embodiment is provided for preventing the body 10 from being damaged due to the length X1 of the body 10, thereby preventing the yield from being decreased. The first lead frame 21 is disposed in a first region of the concave portion 16, and a portion of the first lead frame 21 is disposed on a bottom of the concave portion 16. A first cavity 25, which has a depth lower than the bottom of the concave portion 16, is provided in an inner side region of the first lead frame 21. The first cavity 25 includes a concave shape, such as a cup or a recess, which is concaved from the concave portion 16 toward the bottom of the body 10.

A side surface and a bottom of the first cavity 25 may be formed by the first lead frame 21 and an outer side surface of the first cavity 25 may be bent to be inclined or perpendicular to the bottom of the first cavity 25. Corresponding two side surfaces of the side surfaces of the first cavity 25 may be inclined at the same angle or the mutually different angles. The bottom of the first cavity 25 may be made flat and the first region may correspond to a region in which the first light emitting chip 71 is disposed.

The second lead frame 31 is disposed in a second region spaced apart from the first region of the concave portion 16, and a portion of the second lead frame 31 is disposed on the bottom of the concave portion 16. A second cavity 35, which has a depth lower than the bottom of the concave portion 16, is provided in an inner side region of the second lead frame 31. The second cavity 35 includes a concave shape, such as a cup or a recess, which is concaved from the top surface of the second lead frame 31 toward the bottom of the body 10. The bottom and side surfaces of the second cavity 35 may be formed by the second lead frame 31, and the side surfaces of the second cavity 35 may be bent to be may be inclined or perpendicular to the bottom of the second cavity 35. Corresponding two side surfaces of the side surfaces of the second cavity 35 may be inclined at the same angle or the mutually different angles. The bottom of the second cavity 35 may be made flat and the second region may correspond to a region in which the second light emitting chip 72 is disposed.

The first cavity 25 and the second cavity 35 may be formed in the same shape and in a polygon or ellipse shape when viewed from the top. Further, the first and second cavities 25 and 35 may be disposed in a point symmetry or line symmetry structure when viewed from the top. Each of the first and second cavities 25 and 35 may include a base part which corresponds to a bottom region, a side part bent from the base part, and an outer part bent from the side part.

As show in FIG. 6, the bottoms of the first and second cavities 25 and 35 may have a rectangular shape, a square shape, a partially curved shape, a circle shape or an ellipse shape, but the embodiment is not limited thereto. The bottoms 22 and 32 of the first and second cavities 25 and 35 may be exposed from a lower portion of the body 10 and may be disposed on the same plane as the bottom of the body 10. When the bottoms 22 and 32 of the first and second cavities 25 and 35 may be disposed the same plane as the bottom of the body 10, an adhesive strength of a bonding member such as solder may be improved. Further, the first and second cavities 25 and 35 conduct the heat generated from the first and second light emitting chips 71 and 72.

As shown in FIGS. 2 to 6, specifically FIG. 2, the first lead frame 21 may include a first lead part 23. The first lead part 23 may be disposed at the bottom 17 of the body 10 and may be protruded to the third side wall 13 of the body 10. The second lead frame 31 may include a second lead part 33. The second lead part 33 may be disposed at the bottom 17 of the body 10 and may be protruded to the fourth side wall 14 of the body 10. The first and second lead parts 23 and 33 may be disposed the same plane as the bottom 17 of the body 10, an adhesive strength of a bonding member such as solder may be improved.

The first lead frame and part 21 and 23 and the second lead frame and part 31 and 33 may be mounted on a circuit substrate. The first and second lead frames 21 and 31 may have a thickness of 0.15 mm or 0.18 mm more, or for example, in the range of 0.20 mm~0.25 mm. The first and second lead frames 21 and 31 perform a function of a lead frame for supplying power.

The connecting frame 46, which is spaced apart from the first and second lead frames 21 and 31 in the bottom region of the concave portion 16, serves as a middle connecting terminal. As shown in FIG. 3, a portion 46-1 of the connecting frame 46 may be exposed on the first side wall 11 of the body 10. If the first and second lead frames 21 and 31 are connected to the first and second light emitting chips 71 and 72, the connecting frame 46 may be removed.

The first and second lead frame 21 and 31 and the connecting frame 46 may include a metallic material, for example, at least one of titanium (Ti), copper (Cu), nickel (Ni), gold (Au), chrome (Cr), tantalum (Ta), platinum (Pt), tin (Sn), silver (Ag), and phosphor (P), and may be configured as a single metal layer or multi-metal layers. The first and second lead frame 21 and 31 and the connecting frame 46 may have the same thickness, but the embodiment is not limited thereto.

The first light emitting chip 71 is disposed in the first cavity 25 of the first lead frame 21 and is adhesive onto the first cavity 25 with a first adhesive member 81. The second light emitting chip 72 is disposed in the second cavity 35 of the second lead frame 31 and is adhesive onto the second cavity 35 with a second adhesive member 82. The first and second adhesive members 81 and 82 may be an insulation adhesive or a conductive adhesive. The insulation adhesive may include a material such as epoxy or silicon, and the conductive adhesive may include a bonding material such as a solder. The first and second adhesive members 81 and 82 may further include metallic oxide in order to improve thermal conductivity, but the embodiment is not limited thereto.

The first and second light emitting chips 71 and 72 may selectively emit light in the range between a visible ray band and an ultraviolet (UV) band. For example, one of a red LED chip, a blue LED chip, a green LED chip, a yellow green LED chip, and a white LED chip may be selected as the first and second light emitting chips 71 and 72. Each of the first and second light emitting chips 71 and 72 includes an LED chip having at least one of a compound semiconductor of group III-V elements and a compound semiconductor of group II-VI elements.

The first light emitting chip 71 is connected to the first lead frame 21 disposed on the bottom of the concave portion 16 through a first wire 73 and is connected to the connecting frame 46 through a second wire 74. The second light emitting chip 72 is connected to the connecting frame 46 through a third wire 75 and is connected to the second lead frame 31 disposed on the bottom of the concave portion 16 through a fourth wire 76. The connecting frame 46 electrically connects the first light emitting chip 71 to the second light emitting chip 72.

A protective device (not shown) may be disposed on a portion of the first or second lead frame 21 or 31. The protective device may be implemented by using a thyristor, a zener diode, or transient voltage suppression (TVS). The zener diode may be used to protect a light emitting chip from an electro static discharge (ESD). The protective device may be connected in parallel to the first and second light emitting chips 71 and 72 to protect the first and second light emitting chips 71 and 72.

The molding member 40 may be formed in at least one of the concave portion 16, and the first and second cavities 25 and 26. For example, the molding member 40 may be formed in the concave portion 16, and the first and second cavities 25 and 26. The molding member 40 may be formed of a transparent resin material such as silicon or epoxy, and may be formed in a single layer or a multilayer.

Further, the molding member 40 may include phosphor. The phosphor may be added to the molding member 40 formed in at least one region of the first and second cavities 25 and 35, but the embodiment is not limited thereto. The phosphor may include one selected from YAG, TAG, Silicate, Nitride, and oxy-nitride materials. The phosphor may include at least one of a red phosphor, a yellow phosphor, and a green phosphor, but the embodiment is not limited thereto. A top surface of the molding member 40 may have at least one of a flat shape, a concave shape, a convex shape, and a light exit surface, but the embodiment is not limited thereto.

The top surface of the molding member 40 may be a light exit surface. An optical lens may be provided in an upper portion of the molding member 40, and may include a convex lens, a concave lens or a convex lens having a total reflection surface at a central portion thereof, but the embodiment is not limited thereto.

Referring to FIGS. 1, 3, 4 and 6, at least one of the first and second side walls 11 and 12 of the body 10 may include at least one recess structure which is recessed at a predetermined depth from the first and second side walls 11 and 12 in an inner direction of the body 10. The recess structure of the body 10 is concaved from the first and second side walls 11 and 12 toward the inner direction of the body 10. A hanger, which supports the body 10 when injection-molding the body 10, may be inserted into the recess structure, so that the damage of the body 10 may be prevented. Hereinafter, the recess structure will be described as a recess portion for the purpose of explanation and one or a plurality of recess portions may be disposed.

As shown in FIGS. 3, 4 and 6, for example, first and second recess portions 51 and 52 are disposed in the first side wall 11 and third and fourth recess portions 53 and 54 are disposed in the second side wall 12 of the body 10. An interval D1 between the first and second recess portions 51 and 52 is equal to an interval between the third and fourth recess portions 53 and 54. An interval D1 between the first and second recess portions 51 and 52 is equal to or larger than a distance G1 between the bottoms 22 and 32 of the first and second cavities 25 and 35. The first and third recess portions 51 and 53 face each other and the second and fourth recess portions 52 and 54 face each other. As shown in FIG. 7, a virtual segment of connecting the first recess portion 51 to the third recess portion 53 may be disposed in a direction which is perpendicular to the line X2 parallel to the first or second side wall 11 or 12. The virtual segment of connecting the first recess portion 51 to the third recess portion 53 may be disposed in parallel to a virtual segment of connecting the second recess portion 52 to the fourth recess portion 54.

The first to fourth recess portions 51 to 54 are opened from the bottom 17 of the body 10 and are connected to the bottom 17 of the body 10.

As shown FIG. 5, the distance D2 from the first recess portion 51 to the third side wall 13 may be equal to the distance from the third recess portion 53 to the third side wall 13 and the distance from the second recess portion 52 to the fourth side wall 14 may be equal to the distance from the fourth recess portion 54 to the fourth side wall 14. The first and third recess portions 51 and 53 may be placed to face each other. The second and fourth recess portions 52 and 54 may be formed at the positions at which the second and fourth recess portions 52 and 54 correspond to each other or are overlapped in a horizontal direction. The bottom of the first cavity 25 is disposed between the first and third recess portions 51 and 53 and the bottom of the second cavity 35 is disposed between the second and fourth recess portions 52 and 54.

The distance D2 between the first recess portion 51 and the third side wall 13 of the body 10 may be 130 μm or more for example, in the range of 130 μm~500 μm. Since the distance D2 is longer than the width (T3 in FIG. 2) of the top surface of the body 10, an impact transferred to the body 10 through the first recess portion 51 may be minimized. The width T3 of the top surface 15 of the body 10 may be 130 μm or more and may be narrower than the distance D2. That is, the recess portions 51 to 54 of the body 10 may be formed to be deeper than the width, that is, the rim region of the top surface of the body 10. The width T3 may be the gap between the third or fourth side wall 13 or 14 and the concave portion 16, that is, the minimum gap.

As shown in FIG. 8, the width T4 of the top surface of the body 10 is the gap between the first or second side wall 11 or 12 and the concave portion 16. The width T4 may be equal to or narrower than the width T3, but the embodiment is not limited thereto.

As shown in FIGS. 5 and 8, since the heights of the first to fourth recessed 51 to 54 may be the distances from the bottom of the body 10 and may be the same, only the height T2 of the first recess portion 51 will be described below. The height T2 of the first recess portion 51 may be formed from the bottom 17 of the body 10 at 15 μm to more. For example, the height T2 of the first recess portion 51 may be formed in the range of 15 μm~250 μm. The height T2 of the first recess portion 51 may be equal to the thickness T1 of the lead frames 21 and 31 or may be thinner than the thickness T1. When the height T2 of the first recess portion 51 is greater than that in the range, the solidity of the body 10 may be weakened.

Refer to the width W1 of the first recess portion 51 for the width of the first to fourth recess portions 51, 52, 53 and 54. The width W1 of the first recess portion 51 may be 50 μm or more, and for example, in the range of 50 μm-500 μm. Since the width, which the inserting protrusion of the hanger can support, is 50 μm or more, the width W1 of the first recess portion 51 may be formed to be 50 μm or more or to be larger than the thicknesses of the first and second lead frames 21 and 31. Further, the width W1 may be ⅟₁₀ or less based on the length X1 of the body 10, but the embodiment is not limited thereto. When the widths W1 of the first to fourth recess portions 51 to 54 are narrower than that in the range, the body 10 may not be supported. And, when the width W1 is out of the range, the strength of the body 10 may be weakened. The width W1 of the first recess portion 51 may be narrower than that of one of the side walls of the first and second light emitting chips 71 and 72. Further, the width W1 of the first recess portion 51 may be formed to be narrower than the distance G1 between the first and second cavities 25 and 35 shown in FIG. 6. In addition, the width W1 of the first recess portion 51 may be formed to be narrower than the widths (in X axis direction) of the bottoms of the first and second cavities 25 and 35.

Referring to FIGS. 7 and 8, the depths D4 of the first to fourth recess portions 51 to 54 may be equal to or different from the width W1, and for example, may formed to be in the range of 30 μm-130 μm. When the width W1 is 100 μm or less, the depths D4 of the first to fourth recess portions 51 to 54 may be formed to be in the range of 50 µm~100 µm. The depth D4 of the first recess portion 51 may be narrower than the width of one of the side surfaces of the first and second light emitting chips 71 and 72. The depth D4 may be shorter than the distances between the first and second side walls 11 and 12 and the bottoms of the first and second cavities 25 and 35.

The depths D4 of the recess portions 51 to 54 may be deeper than the width T3 of the top surface 15 of the body 10. For example, the depths D4 of the recess portions 51 to 54 may be formed to be deeper than the minimum gap of the gaps between the first to fourth side walls 11 to 14 and the concave portion 16. For example, the depths D4 of the recess portions 51 to 54 may be formed to be deeper than the width T3 or T4 of the top surface of the body 10. For example, the depth D4 may be deeper than the width T4 of the top surface and may be narrower than the distance B4 between the bottom of the concave portion 16 and the first side wall 11. When the depth D4 is deeper than the distance B4, the first and second side walls 11 and 12 are weakened, and when the depth D4 is narrower than the width T4 of the top surface, the performance of the hanger is deteriorated.

As shown in FIG. 6, at least two recess portions 51 to 54 may exist in the first or second side wall 11 or 12 of the body 10. At least four recess portions, for example, six to eight recess portions may exist in the first or second side wall 11 or 12. As the length X1 of the body 10 is lengthened in the long-axis direction, the number of recess portions may be increased, but the embodiment is not limited thereto. The recess portions 51 to 54 may be formed symmetrically to the segment extending in the longitudinal direction X1 by passing through the centers of the cavities 25 and 35 of the body 10, but the embodiment is not limited thereto.

Referring to FIGS. 1 and 6, the first and third recess portions 51 and 53, which are disposed in an edge region in the bottom 17 of the body 10, are disposed near a segment Y2 which extends through the center of the bottom surface 22 of the first cavity 25 in perpendicular to the bottom surface 22 of the first cavity 25. The second and fourth recess portions 52 and 54 are disposed near a segment Y3 which extends through the center of the bottom surface 32 of the second cavity 35 in perpendicular to the bottom surface 32 of the second cavity 35. The segments Y2 and Y3 are parallel to each other and perpendicular to the segments of the first and second side walls 11 and 12. The interval D1 between the first and second recess portions 51 and 52 or the third and fourth recess portions 53 and 54 may be larger than the distance G1 between the first and second cavities 25 and 35. The distance G1 is a distance between the bottom surfaces of the first and second cavities 25 and 35.

The interval D1 between the first and second recess portions 51 and 52 or the third and fourth recess portions 53 and 54 may be larger than the gap G0 (in FIG. 2) between the first and second light emitting chips 71 and 72. The gap G0 is a distance between the centers of the first and second light emitting chips 71 and 72.

Referring to FIG. 7, the distance G2 between the first recess portion 51 and the bottom surface 22 of the first cavity 25 is equal to or different from the distance G3 between the third recess portion 53 and the bottom surface 22 of the first cavity 25. When the distances G2 and G3 are equal to each other, the body 10 may be prevented from warping.

Referring to FIGS. 6 and 8, the gap D3 between the lead frames 21 and 31 and the recess portions 51 to 54 may be equal to or larger than the thickness T1 of the lead frames 21 and 31. For example, the gap D3 may have a width of 200 µm or more. When the gap D3 is narrower than the above range, the strength of the body 10 may be weakened.

Referring to FIGS. 6 and 9, specifically FIG. 9, a first outer region 11A, which is exposed at the first side wall 11 of the body 10 between the first and second recess portions 51 and 52, may be formed at a second angle θ2 between the bottom 17 of the body 10 and the first side wall 11 and a third angle θ3 different from the second angle θ2. The second angle θ2 may be less than 90° and for example, may be in the range of 60° to 85°. The third angle θ3 may be almost perpendicular to the bottom 17 (for example, in the range of 90° to 92°). Thus, an inner side portion of the hanger makes tight contact with the first and second lower regions 11A and 12A of both side walls 11 and 12 of the body 10, so that the first lower region 11A and an upper region of the first side wall 11 may be formed at mutually different angles. Refer to the first lower region 11A for the second lower region 12A in the second side wall 12 of the body 10 between the third and fourth recess portions 53 and 54. The lower regions 11A and 12A may be perpendicular to the bottom of the body 10 and may be connected to an inclined upper region.

As described above, the recess portions 51 to 54, which are concaved inward more than the side walls 11 and 12 of the body 10, are formed at lower portions of the first and second side walls 11 and 12, which are long sides of the body 10, by using the inserting protrusion of the hanger. Further, the inner side portion of the hanger makes contact with the first and second lower regions 11A and 12A of the first and second side walls 11 and 12 of the body 10, so that the damage of the body 10 having the length longer than the width may be reduced. Thus, the yield of the light emitting device 100 may be improved and the reliability of the light emitting device 100 and the lighting system having the same may be improved.

FIGS. 10 to 14 are views illustrating a process of fabricating a light emitting device according to the first embodiment. As one example, a process of fabricating a single light emitting device will be described below.

Figure 10:
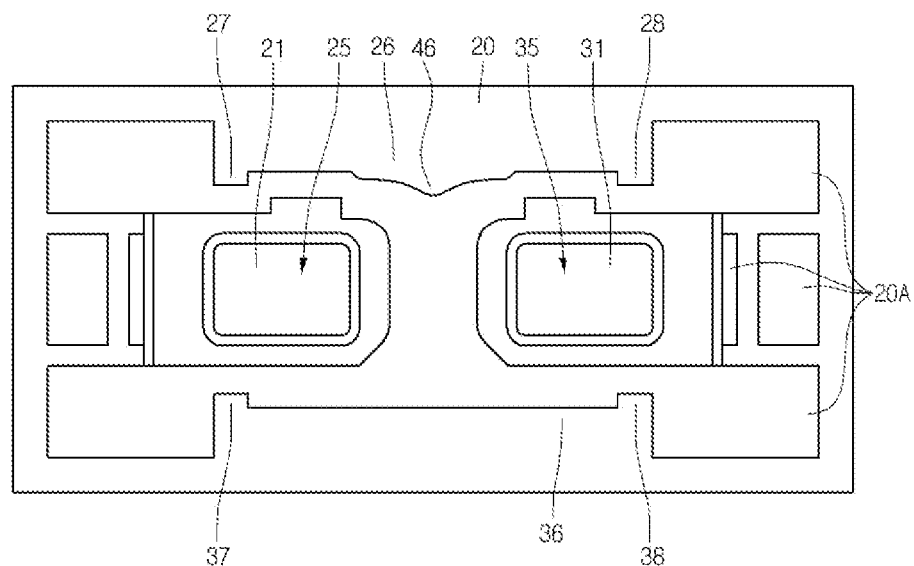
FIGS. 10 to 14 are views illustrating a process of fabricating a light emitting device.

Referring to FIG. 10, the first lead frame 21 having the first cavity 25, the second lead frame 31 having the second cavity 35 and the connecting frame 46 are supported by press working a metallic frame 20. Mutually different frames 21, 31 and 46 are formed by a plurality of holes 20A in the metallic frame 20.

The metallic frame 20 includes first and second hangers 26 and 36. The first hanger 26 is disposed in one side direction of the first and second lead frames 21 and 31, the width of the first hanger 26 corresponds to the interval D1 of the recess portions adjacent thereto, and the first and second inserting protrusions 27 and 28 are protruded from both ends of the first hanger 26. The second hanger 36 is disposed in an opposite side direction of the first and second lead frames 21 and 31, the width of the second hanger 36 corresponds to the interval D1 of the recess portions adjacent thereto, and the third and fourth inserting protrusions 37 and 38 are protruded from both ends of the second hanger 36.

Figure 11:
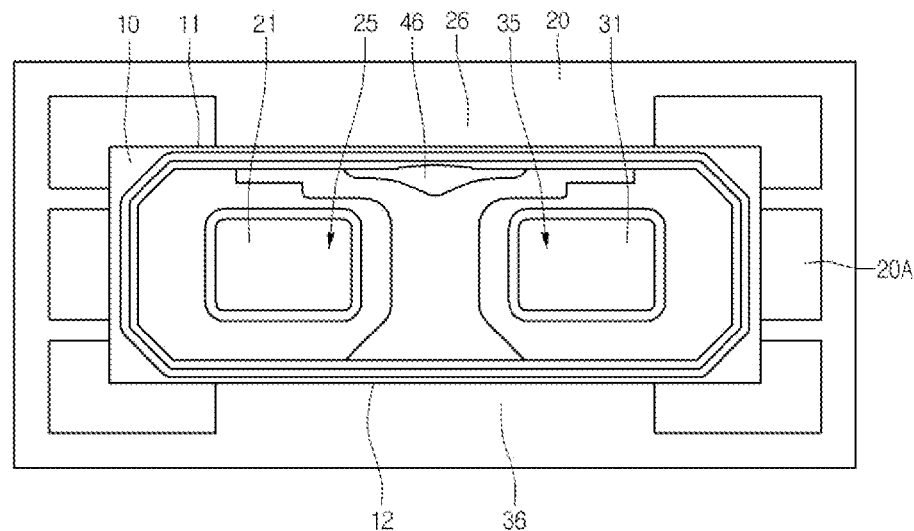

After upper and lower molds are disposed at upper and lower portions of the metallic frame 20, respectively, if an injection molding is performed using a material of the body, the body 10 is injection-molded on a predetermined region of the metallic frame 20 as shown in FIG. 11.

Figure 12:
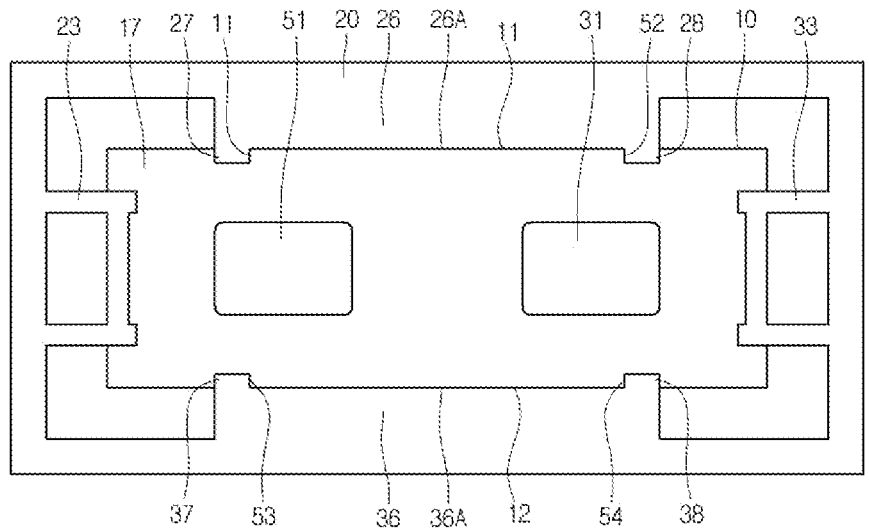
Figure 13:
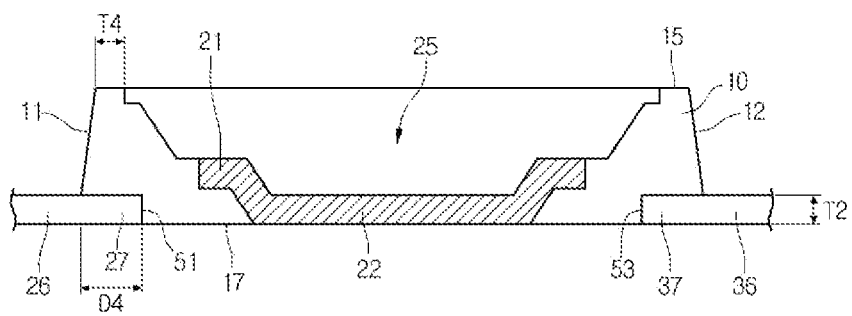
Figure 14:
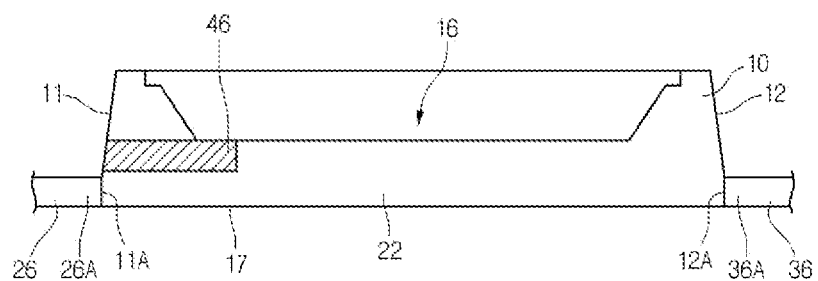

Referring to FIGS. 12 to 14, the inner side portion 26A of the first hanger 26 adheres closely to the first outer region 11A of the first side wall 11, the first inserting protrusion 27 is inserted into the first recess portion 51, and the second inserting protrusion 28 is inserted into the second recess portion 52. The inner side portion 36A of the second hanger 36 adheres closely to the second outer region 12A of the second side wall 12 of the body 10, the third inserting protrusion 37 is inserted into the third recess portion 53, and the fourth inserting protrusion 38 is inserted into the fourth recess portion 54.

As shown in FIG. 14, the inner side portions 26A and 36A of the first and second hangers 26 and 36 adhere closely to the first and second outer regions 11A and 12A of the body 10, so that the body 10 may be prevented from being slack downwardly. Further, the inserting protrusions 27, 28, 37 and 38 which are inserted into the recess portions 51 to 54 support the body 10 at mutually different positions, so that the damage of the body 10 having a long length may be prevented.

Then, the light emitting chips are mounted on the cavities 25 and 35 of the first and second lead frames 21 and 31 and then, are molded with a molding member after being electrically connected through wires. Individual light emitting devices may be obtained by cutting the above structure in units of predetermined packages.

Figure 15:
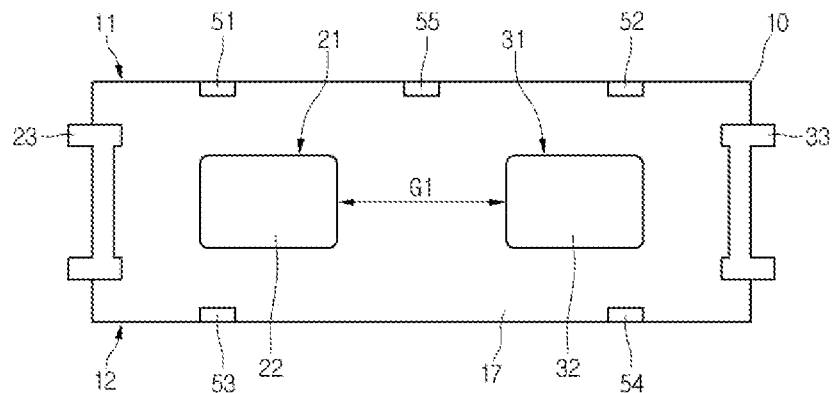
FIGS. 15 and 16 are views showing another arrangement of the recess portions in the light emitting device of FIG. 6.
Figure 16:
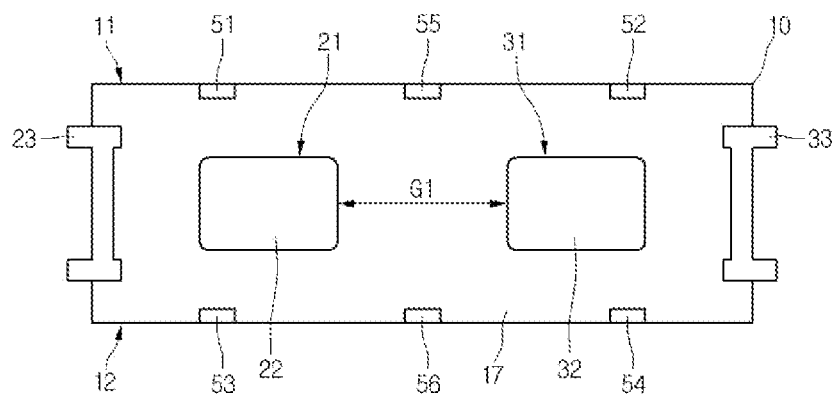

FIGS. 15 and 16 are views showing another arrangement of the recess portions in the light emitting device of FIG. 6.

Referring to FIG. 15, for example, the number of recess portions 51, 52 and 55 disposed at the first side wall 11 of the body 10 is different from the number of recess portions 53 and 54 disposed at the second side wall 12.

The fifth recess portion 55 is disposed at the first side wall 11 between the first and second recess portions 51 and 52. An inserting intrusion is coupled to the fifth recess portion 55. When the body 10 is injection-molded, the inserting protrusion allows the fifth recess portion 55 to be formed. The inserting protrusion may support a side wall region of the body 10 at a region between the first and second lead frames 21 and 31.

Referring to FIG. 16, the fifth and sixth recess portions 55 and 56 are provided at the central portions of the first and second side walls 11 and 12 of the body 10. Inserting protrusions are inserted into the fifth and sixth recess portions 55 and 56, respectively. When the body 10 is injection-molded, the inserting protrusions allow the fifth and sixth recess portion 55 and 56 to be formed. The inserting protrusion may support both side wall regions of the body 10 at a region between the first and second lead frames 21 and 31.

Figure 17:
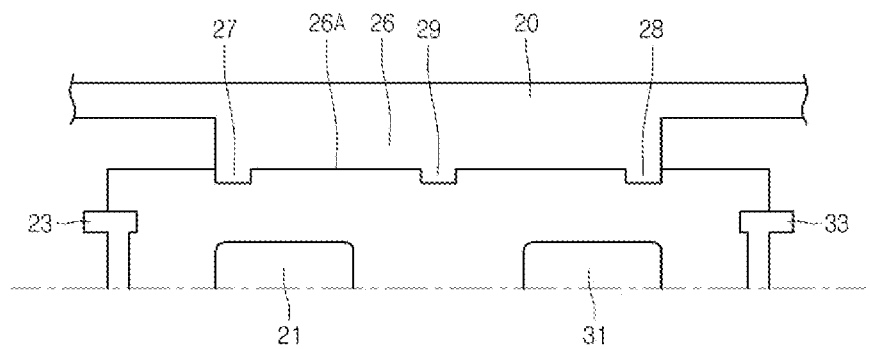
FIG. 17 is a view showing a hanger position when fabricating the light emitting device of FIGS. 15 and 16.

FIG. 17 is a view showing a hanger position when fabricating the light emitting device of FIGS. 15 and 16. The metallic frame 20 further includes a middle inserting protrusion 29 between the first and second inserting protrusions 27 and 28 of the first hanger 26. The second hanger will refer to the first hanger.

Figure 18:
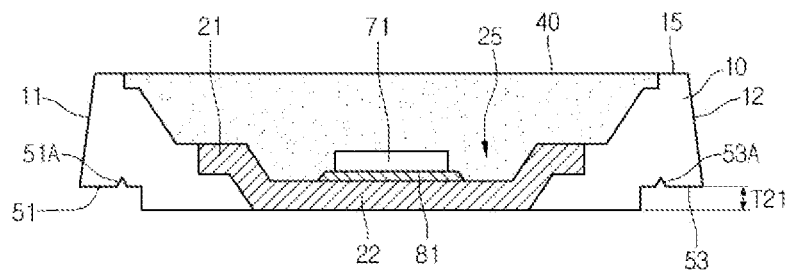
FIGS. 18 and 19 are side sectional views of a light emitting device according to the second embodiment and show a hanger and a shape of a recess.
Figure 19:
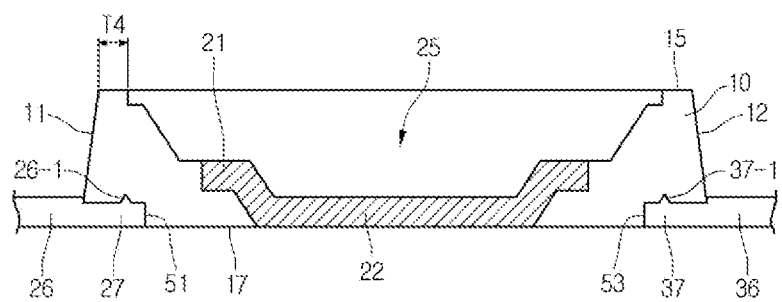

FIGS. 18 to 23 are views showing another example of the recess portions. The recess portions will be described with reference to the first and third recess portions. FIGS. 18 and 19 are side sectional views of a light emitting device according to the second embodiment and show a hanger and a shape of a recess.

Referring to FIG. 18, concave portions 51A and 53A are formed in the first and third recess portions 51 and 53 and are protruded in an upper direction of the body 10. The concave portions 51A and 53A may have a polygonal shape, such as a triangle shape, a rectangular shape or a square shape, or a semi-sphere shape, or may include a rough structure. The height T21 of the first and third recess portions 51 and 53 may be formed to be thinner than the thickness of the lead frames 21 and 31.

Referring to FIG. 19, convex portions 26-1 and 37-1 are formed in the first and third inserting protrusions 27 and 37. The convex portions 26-1 and 37-1 are formed by etching or pressing the upper portions of the first and second hanger 26 and 36, but the embodiment is not limited thereto. The convex portions 26-1 and 37-1 may increase coupling with the body 10, so that the inserting depths of the first and second inserting protrusions 27 and 37 may be reduced.

Figure 20:
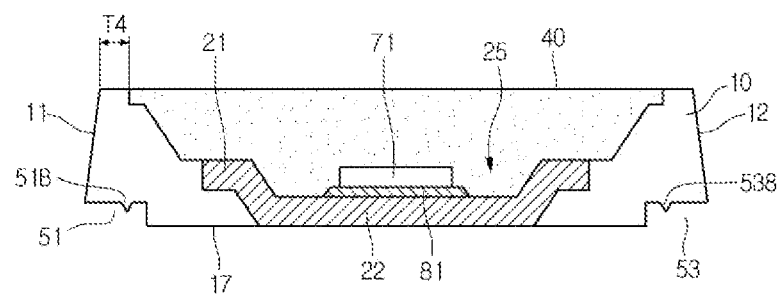
FIGS. 20 and 21 are side sectional views of a light emitting device according to the third embodiment and show another shape of a recess portion and a hanger.
Figure 21:
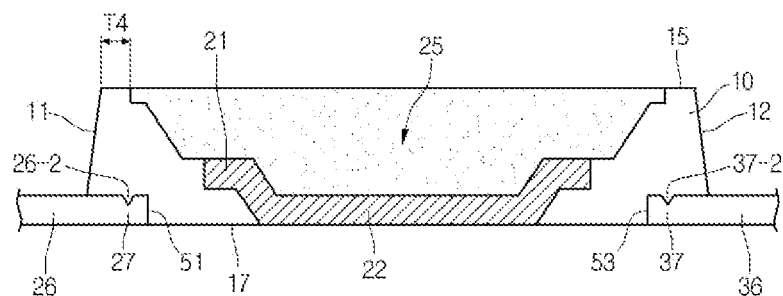

FIGS. 20 and 21 are side sectional views of a light emitting device according to the third embodiment and show another shape of a recess portion and a hanger.

Referring to FIG. 20, convex portions 51B and 53B are formed in the first and third recess portions 51 and 53 and are protruded in a lower direction of the body 10. The convex portions 51B and 53B may have a polygonal shape, such as a triangle shape, a rectangular shape or a square shape, or a semi-sphere shape, or may include a rough structure such as an uneven structure. The height of the first and third recess portions 51 and 53 may be formed to be equal to the thickness of the lead frames 21 and 31.

Referring to FIG. 21, concave portions 26-2 and 37-2 are formed in the first and third inserting protrusions 27 and 37. The concave portions 26-3 and 37-2 are formed in a notch shape of the first and second hanger 26 and 36, but the embodiment is not limited thereto. The concave portions 26-3 and 37-2 may increase coupling with the body 10, so that the inserting depths of the first and third inserting protrusions 27 and 37 may be reduced.

Figure 22:
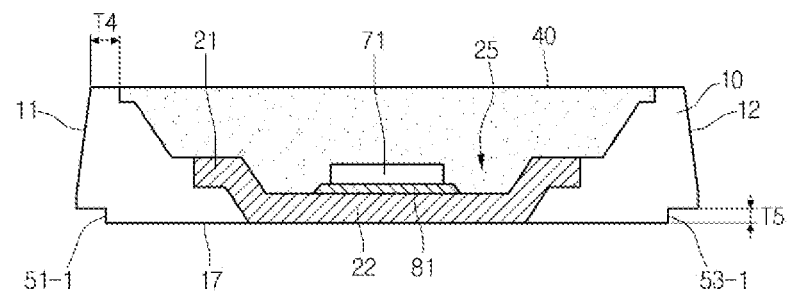
FIGS. 22 and 23 are side sectional views of a light emitting device according to an embodiment, and show an example of a modified shape of a recess.
Figure 23:
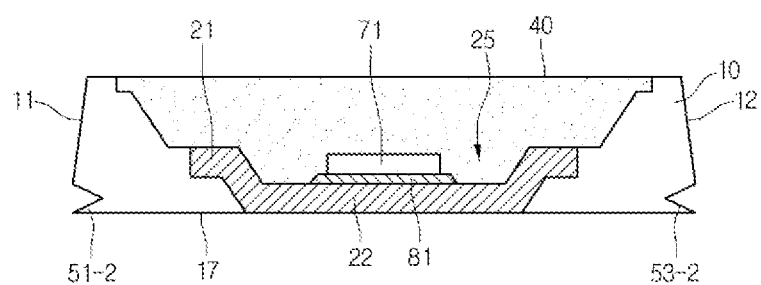

FIGS. 22 and 23 are side sectional views of a light emitting device according to an embodiment, and show an example of a modified shape of a recess.

Referring to FIG. 22, the height T5 of the first and third recess portions 51-1 and 53-1 disposed in the body 10 may be in the range of ⅓ to ⅕ based on the thickness of the first lead frame 21, but the embodiment is not limited thereto. Refer to the above description for the details of the second and fourth recess portions.

Referring to FIG. 23, the first and third recess portions 51-2 and 53-2 disposed in the body 10 are protruded inward from the first and second side walls 11 and 12 to have a sectional surface of a triangle shape. Thus, the inserting protrusions having a triangle shape are disposed on the side walls 11 and 12 which do not make contact with the bottom 17 of the body 10, so that the first and third recess portions 51-2 and 53-2 may be formed.

FIGS. 24 to 27 are rear views of a light emitting device according to the fifth embodiment and show an example of a recess portion having modified position and shape.

Figure 24:
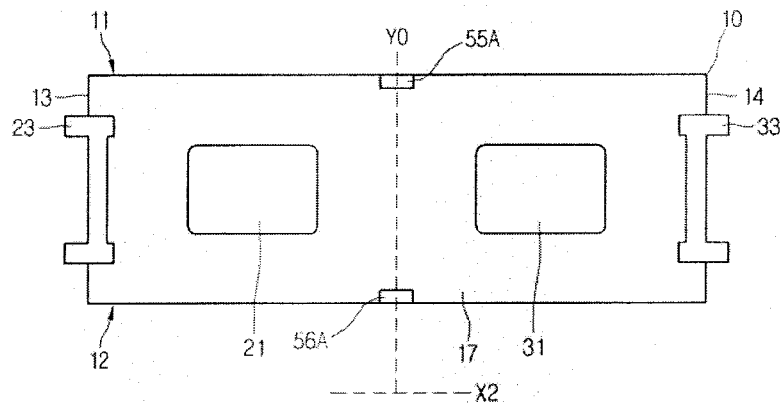
FIGS. 24 to 27 are rear views of a light emitting device according to the fifth embodiment and show an example of a recess portion having modified position and shape.

Referring to FIG. 24, the body 10 of the light emitting device includes the recess portions 55A and 56A disposed at the first and second side walls 11 and 12 corresponding to each other. The recess portions 55A and 56 are disposed corresponding to each other about the line Y0 which is perpendicular to a parallel segment X2 at the center of the body 10. The recess portions 55A and 56A may be disposed corresponding to a gap part which is a region between the first and second lead frames 21 and 31.

The central line Y0 is perpendicular to the segment X2 parallel with an extending segment of the first and second side walls 11 and 12 at the center of the body 10 and may be a line extending through the centers of the first and second side walls 11 and 12.

The recess portions 55A and 56A are disposed corresponding to the central line Y0 perpendicular to the center of the first axis X of the body 10, so that, when the body is injection-molded, the body 10 may be effectively supported in a boundary region between the first and second lead frames 21 and 31. Thus, the boundary region of the first and second lead frames 21 and 31, which is a weak portion of the body 100 including a long side and a short side, may be strengthened.

Figure 25:
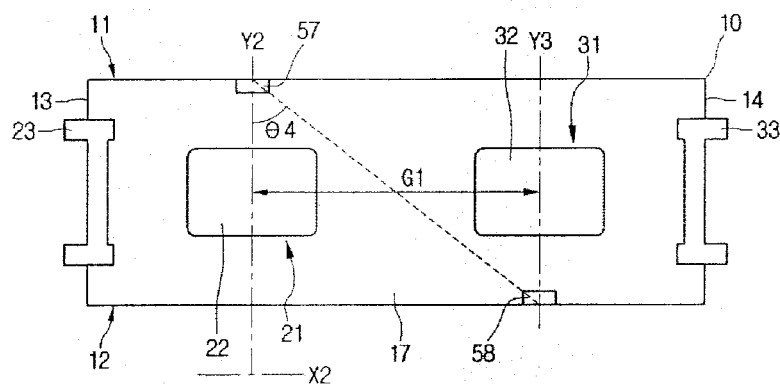

Referring to FIG. 25, the body 10 of the light emitting device is disposed to allow the first recess portion 57 formed at the first side wall 11 and the second recess portion 58 formed at the second side wall 12 to cross each other. The first recess portion 57 is disposed corresponding to the line Y2 which passes through the center of the bottom of the first cavity of the first lead frame 21, and the second recess portion 58 is disposed corresponding to the line Y3 which passes through the center of the bottom 32 of the second cavity of the second lead frame 31. In this case, a virtual line that connects the first and second recess portions 57 and 58 to each other may be formed at an angle (θ4) in the range of 30° to 60° with respect the segment Y2. Further, the first and second recess portions 57 and 58 may be offset from each other about a gap part which is a region between the first and second lead frames 21 and 31.

An inserting protrusion of a hanger inserted into the first and second recess portions 57 and 58 may support outer sides of the first and second cavities to which the greatest load is applied when the body is injection-molded. As shown in FIG. 10, the outer side of the central portion of the body 10 may be supported by the connecting frame 46, but the embodiment is not limited thereto.

Figure 26:
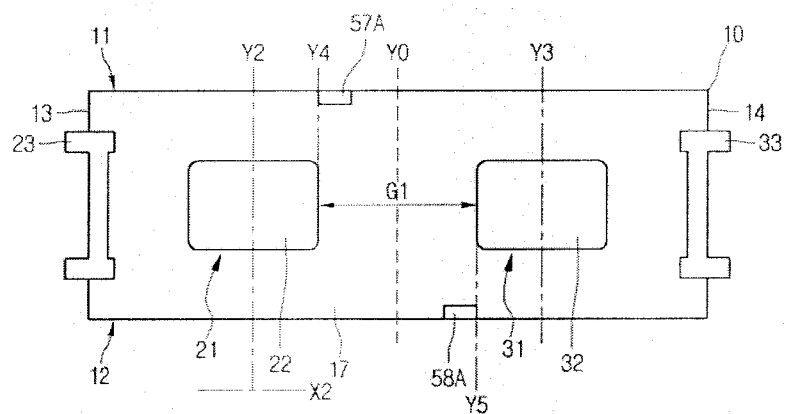

Referring to FIG. 26, the body 10 of the light emitting device is disposed to allow the first recess portion 57A formed at the first side wall 11 and the second recess portion 58B formed at the second side wall 12 to cross each other. The first recess portion 57A may be disposed a region adjacent to the bottom of the first cavity. For example, the first recess portion 57A may be disposed between the central line Y2 perpendicular to the bottom center of the first cavity and the central line Y0 of the body 10. The second recess portion 58A may be disposed a region adjacent to the bottom of the second cavity of the second lead frame 31. For example, the second recess portion 58A may be disposed between the central line Y3 perpendicular to the bottom center of the second cavity and the central line Y0 of the body 10. An inserting protrusion of a hanger inserted into the first and second recess portions 57A and 58B may support an outer region between the first and second cavities to which the greatest load is applied when the body 10 is injection-molded. As shown in FIG. 10, the outer side of the central portion of the body 10 may be supported by the connecting frame 46, but the embodiment is not limited thereto.

Figure 27:
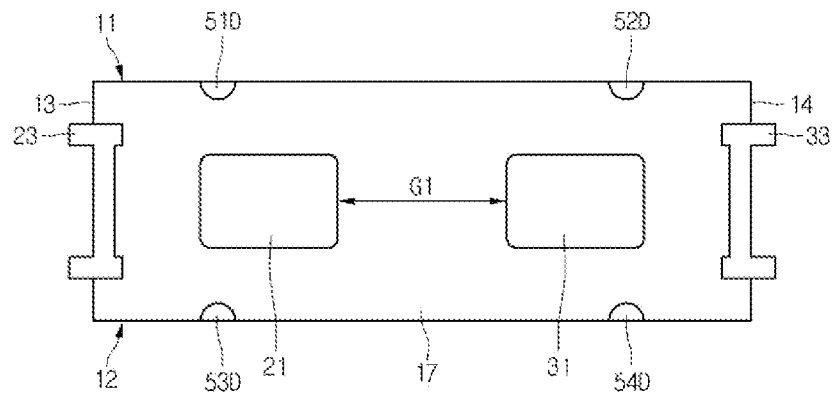

Referring to FIG. 27, the light emitting device includes first to fourth recess portions 51D, 52D, 53D and 54D which have a semi-sphere shape and are formed at the first and second side walls 11 and 12. As another example, the shape of the first to fourth recess portions 51D, 52D, 53D and 54D may include a triangle shape or a stepped shape, but the embodiment is not limited thereto.

Figure 28:
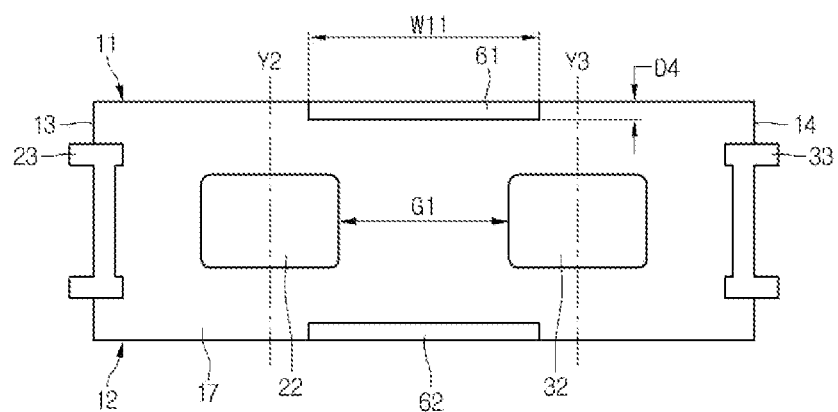
FIGS. 28 and 29 are rear views of a light emitting device according to the sixth embodiment.
Figure 29:
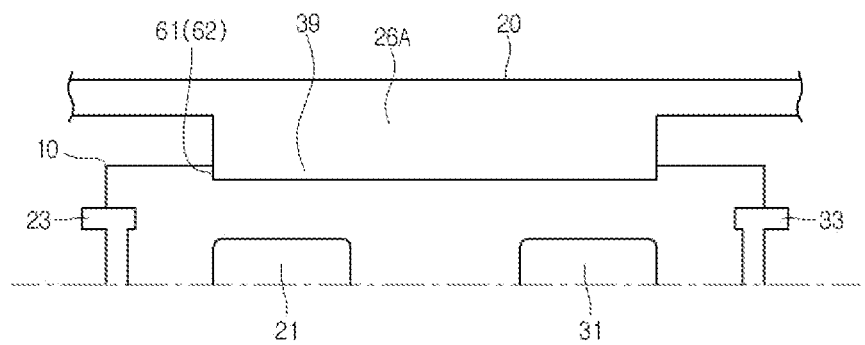

FIGS. 28 and 29 are rear views of a light emitting device according to the sixth embodiment FIGS. 28 and 29 show exemplary lengths of a recess portion, and FIG. 29 shows a hanger.

Referring to FIG. 28, the body 10 of the light emitting device includes the first recess portion 61 of the first side wall 11 and the second recess portion 62 of the second side wall 12 corresponding to each other. The widths W11 of the first and second recess portions 61 and 62 may be larger than the distance G1 between the first and second cavities 22 and 32 and may be narrower than the distance between the center lines Y2 and Y3 of the first and second cavities 22 and 32. The width W11 may be ¼ or more based on the gap between the third and fourth side walls 13 and 14 of the body 10.

Referring to FIG. 29, the inserting protrusion 39 which is the inner side portion 26A of the hanger inserted into the first and second recess portions 61 and 62 may cover the central regions of each side wall 11 and 12 of the body 10. The connecting frame 46 disposed in the body 10 may be removed due to the inserting protrusion 39 which is the inner side portion 26 of the hanger, but the embodiment is not limited thereto. As another embodiment, a resin material such as silicon or epoxy may be filled in the first and second recess portions 61 and 62. The resin material filled in the first and second recess portions 61 and 62 may strengthen the middle portion of the side walls 11 and 12.

Figure 30:
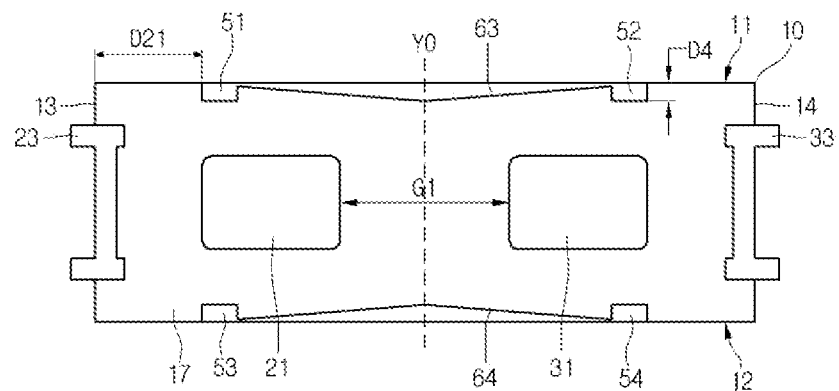
FIGS. 30 to 32 are rear views of a light emitting device according to the seventh embodiment, and show examples of a modified recess.
Figure 31:
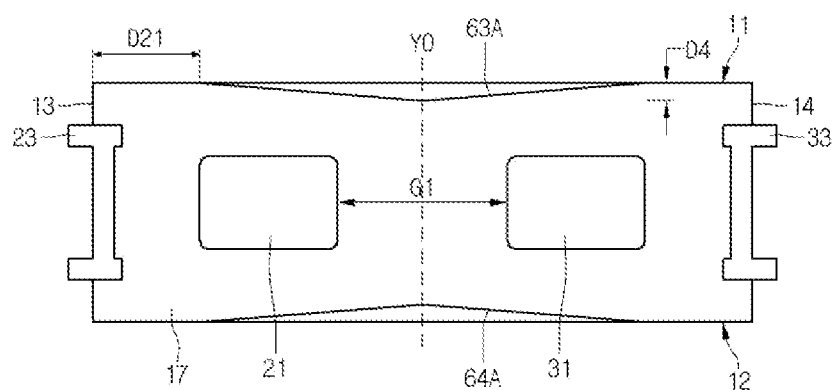
Figure 32:
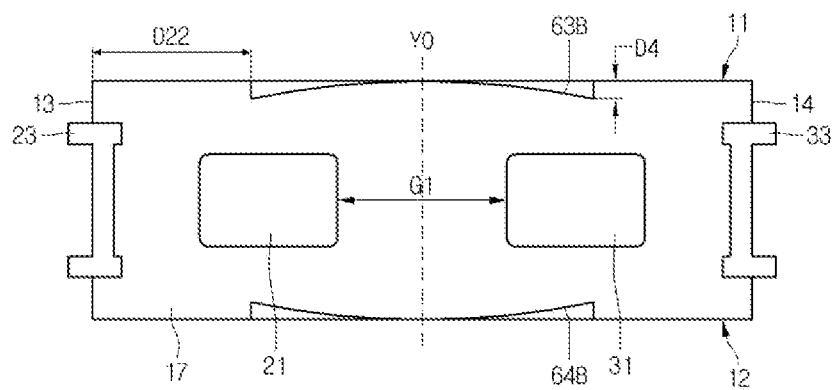

FIGS. 30 to 32 are rear views of a light emitting device according to the seventh embodiment, and show examples of a modified recess.

Referring to FIG. 30, the body 10 of the light emitting device includes the first and second recess portions 51 and 52 disposed at the first side wall 11 and the fifth recess portion 63 disposed between the first and second recess portions 51 and 52. The fifth recess portion 63 may have a width larger than those of the first and second recess portions 51 and 52, and may be connected to the first and second recess portions 51 and 52. The fifth recess portion 63 may be gradually deepened in the direction of the central line Y0 of the body 10 or toward the centers of the first and second side wall 11 and 12. The depth D4 of the first and second recess portions 51 and 52 is equal to or different from the maximum depth of the fifth recess portion 63, but the embodiment is not limited thereto. The width of the fifth recess portion 63 may be ¼ based on the length of the body 10, but the embodiment is not limited thereto.

Refer to the description of the first, second and fifth recess portions 51, 52 and 63 for the details about the third and fourth recess portions 53 and 54 disposed at the second side wall 12 of the body 10 and the structure of the sixth recess portion 64 between the third and fourth recess portions 53 and 54. The fifth and sixth recess portions 63 and 64 may include a triangle shape or a semi-sphere shape, the central portion of which is concaved in an inner side direction of the body 10. As described in the first embodiment, the first to fourth recess portions 51 to 54 may be spaced apart from the third and fourth side walls 13 and 14 of the body 10 by a predetermined distance D21.

Referring to FIG. 31, the light emitting device includes the fifth and sixth recess portions 63A and 64A disposed at the first and second side walls 11 and 12 of the body 10. The widths of the fifth and sixth recess portions 63A and 64A may be ¼ or more based on the length of the body 10. The fifth and sixth recess portions 63A and 64A may be spaced apart from the third and fourth side walls 13 and 14 of the body 10 by the predetermined distance D21, and the depths may be gradually deepened toward the central line Y0 of the body 10. The distance D21 may be 130 μm or more. To the contrary, the maximum depth D4 of the recess portions 63A and 64A may be formed in a region corresponding to the central portion of the body 10 and the depth D4 may be gradually reduced toward the third and fourth side walls 13 and 14.

Referring to FIG. 32, the light emitting device includes the fifth and sixth recess portions 63B and 64B disposed at the first and second side walls 11 and 12 of the body 10. The widths of the fifth and sixth recess portions 63A and 64A may be ¼ or more based on the length of the body 10. The fifth and sixth recess portions 63B and 64B may be spaced apart from the third and fourth side walls 13 and 14 of the body 10 by the predetermined distance D22. The distance D22 may be 130 μm or more. The depths may gradually shallow toward the center of the first and second side walls 11 and 12 or may almost not exist at the central line Y0 of the body 10. Thus, the minimum depth of the recess portions 63B and 64B may be formed in a region corresponding to the central portion of the body 10 and the maximum depth D4 may be formed in a region adjacent to the third and fourth side walls 13 and 14.

Figure 33:
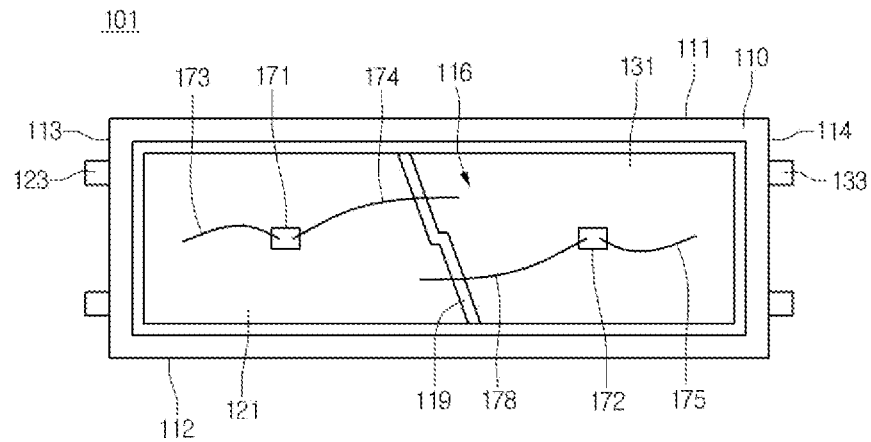
FIG. 33 is a plan view of a light emitting device according to the eighth embodiment.
Figure 34:
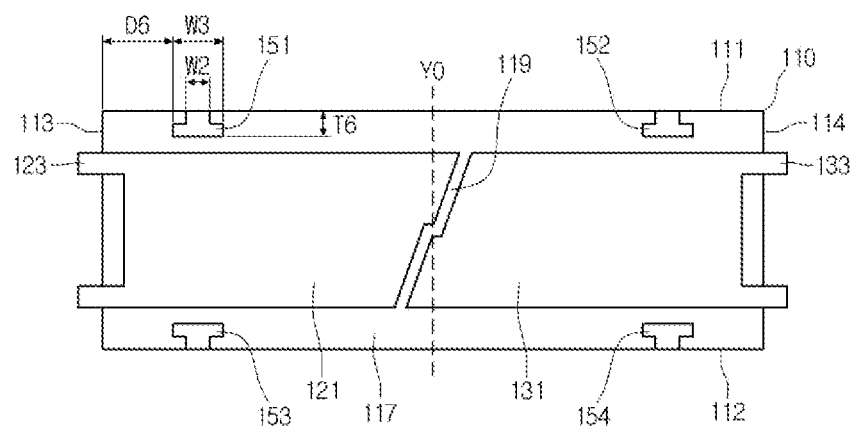
FIGS. 34 to 37 are rear views of the light emitting device of FIG. 33.

FIG. 33 is a plan view of a light emitting device according to the eighth embodiment, and FIG. 34 is a rear view of the light emitting device of FIG. 33.

Referring to FIGS. 33 and 34, the light emitting device 101 includes a body 110 having a concave portion 116, a first lead frame 121 in a first region of a bottom of the concave portion 116, a second lead frame 131 disposed in a second region of the bottom of the concave portion 116, a gap part 119 in the bottom of the concave portion 116 and between the first and second lead frames 121 and 131, light emitting chips 171 and 172, wires 173 to 178, and a molding member (not shown).

The body 110 may include at least one of a resin material such as Polyphthalamide (PPA), silicon (Si), a metallic material, photo sensitive glass (PSG), sapphire ($Al_2O_3$), and a printed circuit board (PCB). For example, the body 110 may include a resin material such as Polyphthalamide (PPA), epoxy or silicon.

An outer appearance of the body 110 may have various shapes such as a triangle shape, a rectangular shape, a polygonal shape, or a circular shape. The first and second lead frames 121 and 131 may be disposed on the bottom and may be mounted on a substrate as a direct type. The first and second lead frames 121 and 131 may be disposed at a side surface of the body 110 and may be mounted on the substrate as an edge type. However, the embodiment is not limited to the above.

The body 110 includes a cavity having an opened upper portion, a side surface and a bottom, and the concave portion 116 having a recess portion structure. A shape of the concave portion 116 may include a circle shape, an ellipse shape, and a polygon shape (for example, a square shape) when viewed from the top. The body 110 may include a plurality of side walls 111 to 114. At least one of the side walls 111 to 114 may be perpendicular or inclined to the bottom of the body 110. For example, a length (that is, long length) of the first and second side walls 111 and 112 may be longer than that (that is, short length) of the third and fourth side walls 113 and 114. For example, the length of the first and second side walls 111 and 112 may be two or more times longer than that of the third and fourth side walls 113 and 114.

The first lead frame 121 is disposed in a first region of the bottom of the concave portion 116, and the second lead frame 131 is disposed in a second region spaced apart from the first region of the bottom of the concave portion 116. The first light emitting chip 171 may be disposed in the first region and the second light emitting chip 172 may be disposed in the second region.

The lower surfaces of the first and second lead frames 121 and 131 may be exposed to the bottom of the body 110 and may be disposed on the same plane with the bottom of the body 110.

The gap part 119 between the first and second frames 121 and 131 may be obliquely disposed. A central portion of the gap part 119 may be formed in a stepped structure. Since the gap part 119 may be formed in the diagonal form, the strength of the boundary portion between the first and second frames 121 and 131 may be enhanced.

A first lead part 123 of the first lead frame 121 may be disposed on the bottom of the body 110 and may be protruded toward the third side wall 113. A second lead part 133 of the second lead frame 131 may be disposed on the bottom of the body 110 and may be protruded toward the fourth side wall 114. Refer to the first embodiment for a material and thickness of the first and second lead frames 121 and 131.

As shown in FIGS. 33 and 34, the first and second lead frames 121 and 131 have no cavity structure. The lower surfaces of the first and second lead frames 121 and 131 are flat. That is, the entire lower surfaces of the first and second lead frames 121 and 131 may be disposed on the same plane. The thickness of the light emitting device 101 may be thinly provided by removing the cavity structure from the first and second lead frames 121 and 131.

The first side wall 111 of the body 110 includes the first and second recess portions 151 and 152, and the second side wall 112 includes the third and fourth recess portions 153 and 154.

An inner width W2 of the first to fourth recess portions 151 to 154 may be narrower than an outer width W3 thereof. The inner portion of the first to fourth recess portions 151 to 154 may be directed to an inner side of the body 110 and the outer portion thereof may be directed to the side wall of the body.

The depth T6 of the first to fourth recess portions 151 to 154 may be formed in the range of 30 μm to 130 μm, but the embodiment is not limited thereto. The first to fourth recess portions 151 to 154 may be spaced apart from each other such that the distance D6 from the outmost second or fourth side wall 113 or 114 may be 130 μm or more.

The inserting protrusion of the hanger inserted into the first to fourth recess portions 151 to 154 may be formed in a shape having a large inner width and a narrow outer width, so that the body may be effectively supported by the structure of the inserting protrusion.

The first light emitting chip 171 may be disposed over the first lead frame 121 and the second light emitting chip 172 may be disposed over the second lead frame 131. The first light emitting chip 171 is connected to the first lead frame 121 through the first wire 173 and is connected to the second lead frame 131 through the second wire 174. The second light emitting chip 172 is disposed over the second lead frame 131. The second light emitting chip 172 is connected to the second lead frame 131 through the third wire 175 and is connected to the first lead frame 121 through the fourth wire 178. The gap part 119 may be disposed is disposed in a diagonal form, so that the second and fourth wires 174 and 178 may be provided in the shortest length.

Figure 35:
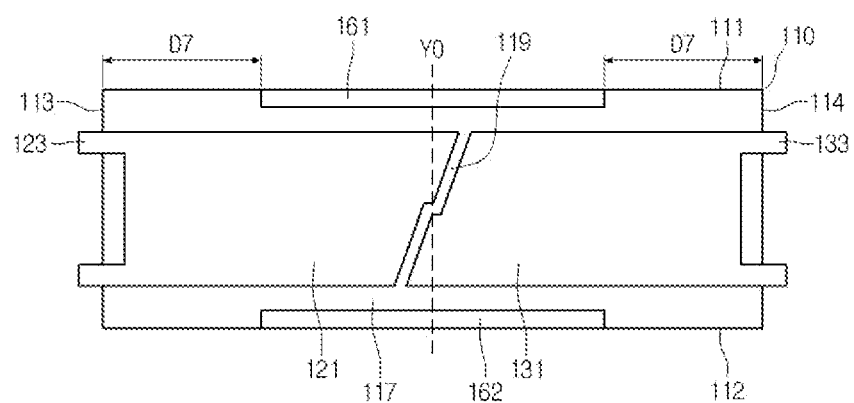

Referring to FIG. 35, the first side wall 111 of the body 110 includes the fifth recess portion 161. The fifth recess portion 161 may be spaced apart from the third and fourth side walls 113 and 114 by a distance of 130 μm or more or for example, 200 μm or more. The second side wall 112 of the body 110 includes the sixth recess portion 162. The sixth recess portion 162 has almost the same width as that of the fifth recess portion 161 and is spaced apart from the third and fourth side walls 113 and 114.

The fifth and sixth recess portions 161 and 162 may have a width which is ¼ or more based on the length of the body 110, but the embodiment is not limited thereto. The longitudinal direction of the body 110 may pass through the centers of the light emitting chips 171 and 172 shown in FIG. 33.

The fifth and sixth recess portions 161 and 162 may be spaced apart from the first and second lead frames 121 and 131 by 200 μm or more. In this case, when the gap between the fifth and sixth recess portions 161 and 162 and the first and second lead frames 121 and 131 is narrow, the strength of the body may be not sufficiently obtained due to the narrow gap.

Figure 36:
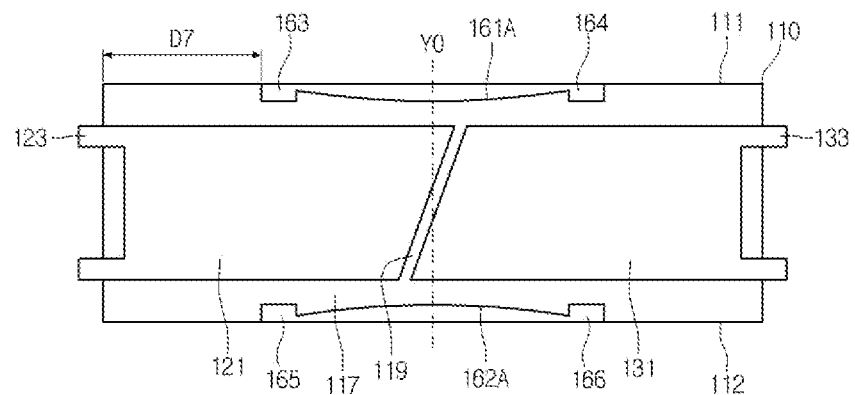

Referring to FIG. 36, the first and second recess portions 163 and 164 are disposed in the first side wall 111 of the body 110, and the fifth recess portion 161A is disposed between the first and second recess portions 163 and 164. The fifth recess portion 161A has a width corresponding to a gap between the first and second recess portions 163 and 164, and may be connected to the first and second recess portions 163 and 164. The fifth recess portion 161A may have a width gradually increased or decreased from the first and second recess portions 163 and 164 to the central line Y0 of the body 100, but the embodiment is not limited thereto.

The third and fourth recess portions 165 and 166 are disposed in the second side wall 112 of the body 110 and the sixth recess portion 162A is disposed between the third and fourth recess portions 165 and 166. Refer to the first, second and fifth recess portions 163, 164 and 161A for the structures of the third, fourth and sixth recess portions 165, 166 and 162A.

Figure 37:
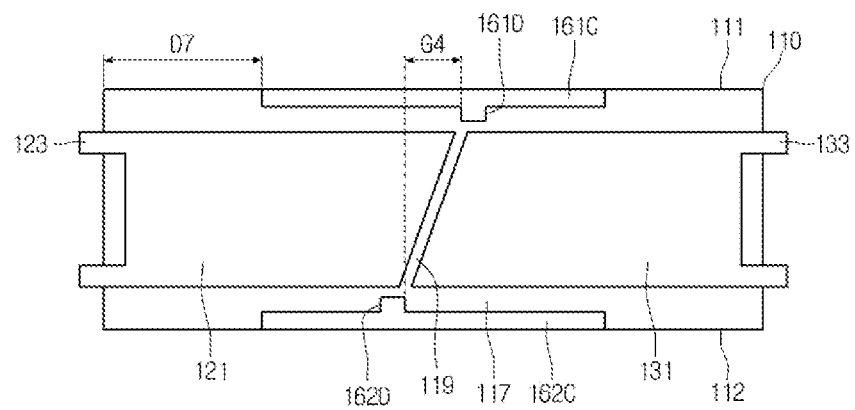

Referring to FIG. 37, the fifth recess portion 161 C is formed in the first side wall 111 of the body 110 and the sixth recess portion 162C is formed in the second side wall 112. The centers of the fifth and sixth recess portions 161C and 162C are positioned at the center of the body 110 and the widths of the fifth and sixth recess portions 161C and 162C may be ¼ or more based on the length of the body 110. Refer to the structures of the recess portions in the first embodiment for the depth of the fifth and sixth recess portions 161C and 162C.

The seventh recess portion 161D is formed in the fifth recess portion 161C. The seventh recess portion 161D may have a width narrower than that of the fifth recess portion 161C, for example, in the range of 50 μm to 200 μm, and have a depth from the fifth recess portion 161C in the range of 10 μm to 50 μm. The seventh recess portion 161D may be disposed corresponding to the gap part 119 between the first and second lead frames 121 and 131.

The eighth recess portion 162D is formed in the sixth recess portion 162C. The eighth recess portion 162D may have a width narrower than that of the sixth recess portion 162C, for example, in the range of 50 μm to 200 μm, and have a depth from the sixth recess portion 162C in the range of 10 μm to 50 μm. The eighth recess portion 162D may be disposed corresponding to the gap part 119 between the first and second lead frames 121 and 131. Thus, the gap G4 between the lines perpendicular to the seventh and eighth recess portions 161D and 162D spaced apart from each other may be 30 μm or more, but the embodiment is not limited thereto.

Figure 38:
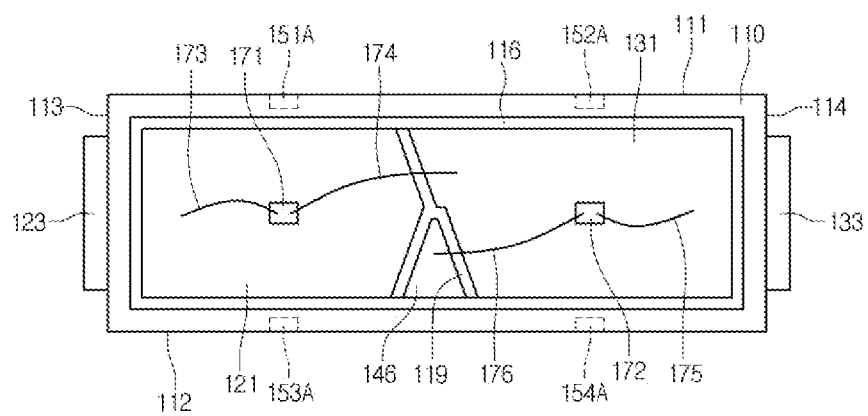
FIG. 38 is a plan view showing a light emitting device according to the ninth embodiment.

FIG. 38 is a plan view of a light emitting device according to the ninth embodiment. In the description of the ninth embodiment, the same configurations as those of FIG. 38 refer to FIG. 33 and the first embodiment.

Referring to FIG. 38, the first to fourth recess portions 151A to 154A are formed in the first and second side walls 111 and 112 of the body 110. This structure may be selectively applied to the above-described embodiments, but the embodiment is not limited thereto.

The connecting frame 146 is disposed between the first and second lead frames 121 and 131 in the body 110. The connecting frame 146, which is disposed between the first and second lead frames 121 and 131, serves as a middle connecting terminal.

Figure 39:
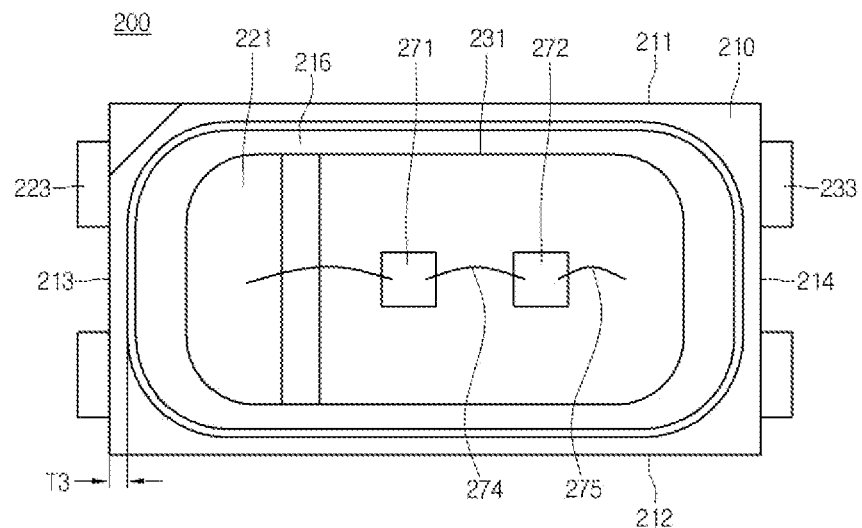
FIG. 39 is a plan view showing a light emitting device according to the tenth embodiment.
Figure 40:
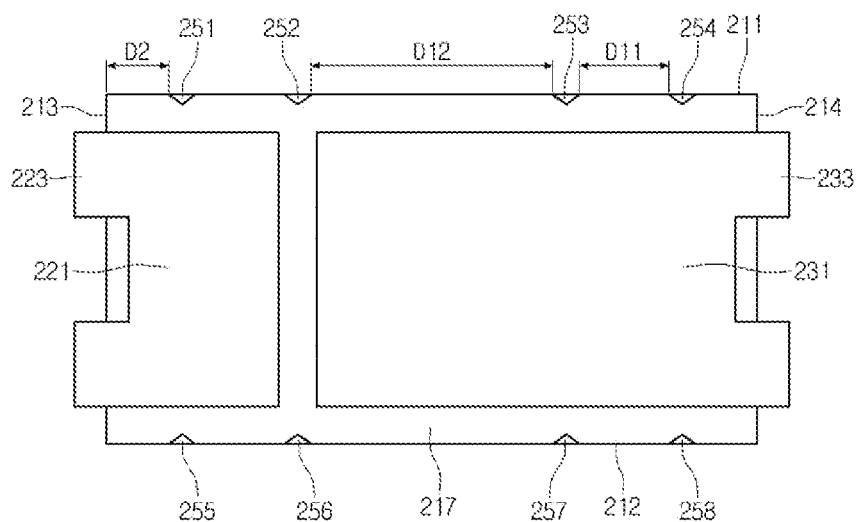
FIG. 40 is a rear view of the light emitting device of FIG. 39.
Figure 41:
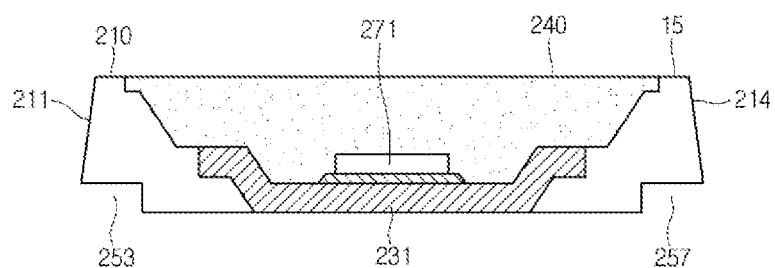
FIG. 41 is a side sectional view of the light emitting device of FIG. 39.

FIG. 39 is a plan view of a light emitting device according to the tenth embodiment. FIG. 40 is a rear view of the light emitting device of FIG. 39. FIG. 41 is a side sectional view of the light emitting device of FIG. 39.

Referring to FIG. 39, the light emitting device 200 includes a body 210 having a concave portion 216, first and second lead frames 221 and 231 in the concave portion 216, light emitting chips 271 and 272, wires 273 to 275 and a molding member 240.

The first lead frame 221 includes a first lead part 223 disposed in the third side wall 213 of the body 210 and a second lead part 233 disposed in the fourth side wall 214.

The second lead frame 231 may be longer than that of the first lead frame 221 and for example, may be ½ based on the length of the body 110.

The first and second light emitting chips 271 and 272 are disposed on the second lead frame 231. The first light emitting chip 271 is connected to the first lead frame 221 through the wire 273 and is connected to the second light emitting chip 272 through the wire 274. The second light emitting chip 272 may be connected to the second lead frame 231 through the wire 275.

Referring to FIGS. 40 and 41, a plurality of recess portions, for example, two recess portions or more may be disposed in the first side wall 211 of the body 210. For example, the first to fourth recess portions 251 to 254 are disposed in the first side wall 211. The plurality of recess portions, for example, two recess portions or more may be disposed in the second side wall 212. For example, the fifth to eighth recess portions 255, 256, 257 and 258 are disposed in the second side wall 212. However, the embodiment is not limited the above.

The first to fourth recess portions 251, 252, 253 and 254 correspond to the fifth to eighth recess portions 255, 256, 257 and 258, respectively. In this case, they may be disposed symmetrically to each other about the longitudinal direction of the body 210.

The first to fourth recess portions 251, 252, 253 and 254 and the fifth to eighth recess portions 255, 256, 257 and 258 may be spaced apart from the third and fourth side walls 213 and 214 by a predetermined distance D2. Refers to the first embodiment for the distance D2.

The intervals D11 and D12 between the neighbor recess portions among the first to fourth recess portions 251, 252, 253 and 254 may be different from each other. For example, the interval D11 between the outermost first and fourth recess portions 251 and 254 and the second and third recess portions 252 and 253 adjacent to the first and fourth recess portions 251 and 254 may be equal to each other, and the interval D12 between the second and third recess portions 252 and 253 may be larger than the interval D11. The positions of the first to eighth recess portions 251 to 258 may be configured by taking into consideration the length difference between the first and second lead frames 221 and 231 and the boundary regions of the first and second lead frames.

The embodiment may prevent the body from being damaged when the light emitting device is injection-molded, and may provide the light emitting device having the recess portions which can support the body coupled to the cavities of the lead frames. According to the embodiment, the yield rate and the reliability of the light emitting device may be improved. The embodiment can improve the reliability of the light emitting device and a lighting apparatus having the same.

Figure 42:
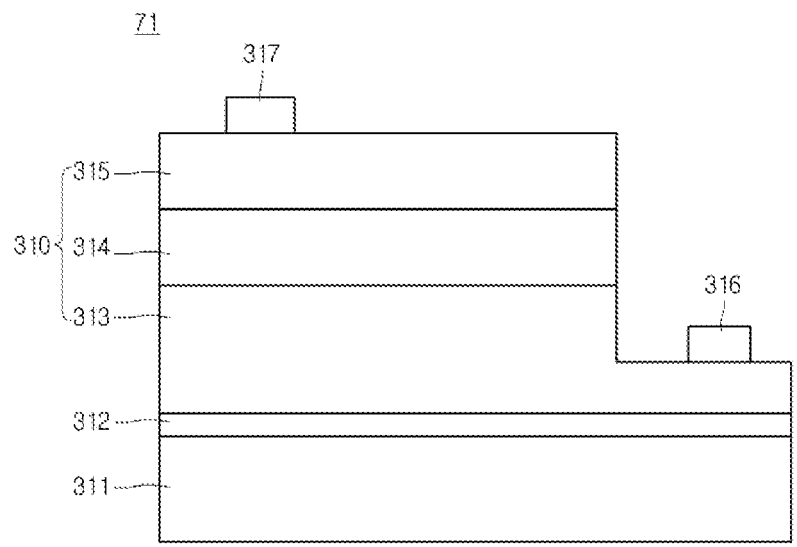
FIG. 42 is a sectional view showing one example of a light emitting chip in a light emitting device according to the embodiment.

FIG. 42 is a side sectional view showing one example of the light emitting chip according to the embodiment.

Referring to FIG. 42, the light emitting chip 71 includes a substrate 311, a buffer layer 312, a light emitting structure 310, a first electrode 316, and a second electrode 317. The substrate 311 may include a substrate including a transmissive material or a non-transmissive material, and may include a conductive substrate or an insulating substrate.

The buffer layer 312 reduces the lattice constant difference between the materials constituting the substrate 311 and the light emitting structure 310, and may include a nitride semiconductor. A nitride semiconductor layer, which is not doped with dopants, is further disposed between the buffer layer 312 and the light emitting structure 310, so that the crystal quality can be improved.

The light emitting structure 310 includes a first conductive semiconductor layer 313, an active layer 314, and a second conductive semiconductor layer 315.

The first conductive semiconductor layer 313 may include the group III-V compound semiconductor doped with the first conductive dopant. For example, the first conductive semiconductor layer 313 may include the semiconductor material having the compositional formula of InxAlyGa1-x-yN ($0 \leq x \leq 1$, $0 \leq y \leq 1$, $0 \leq x+y \leq 1$). In detail, the first conductive semiconductor layer 313 may include the stack structure of layers including one selected from the group consisting of GaN, InN, AlN, InGaN, AlGaN, InAlGaN, AlInN, AlGaAs, GaP, GaAs, GaAsP, and AlGaInP. If the first conductive semiconductor layer 313 is an n type semiconductor layer, the first conductive dopant includes the n type dopant such as Si, Ge, Sn, Se, or Te.

A first clad layer may be formed between the first conductive semiconductor layer 313 and the active layer 314. The first clad layer may include a GaN-based semiconductor, and the bandgap of the first clad layer may be equal to or greater than the bandgap of the active layer 314. The first clad layer has the first conductive type, and confines carriers.

The active layer 314 is disposed on the first conductive semiconductor layer 313, and includes a single quantum well structure, a multiple quantum well (MQW) structure, a quantum wire structure or a quantum dot structure. The active layer 314 has the cycle of the well and barrier layers. The well layer may have the composition formula of InxAlyGa1-x-yN ($0 \leq x \leq 1$, $0 \leq y \leq 1$, $0 \leq x+y \leq 1$), and the barrier layer may have the composition formula of InxAlyGa1-x-yN ($0 \leq x \leq 1$, $0 \leq y \leq 1$, $0 \leq x+y \leq 1$). At least one cycle of the well/barrier layers may be used through the stack structure of InGaN/GaN, GaN/AlGaN, InGaN/AlGaN, InGaN/InGaN, InAlGaN/AlGaN and InAlGaN/InAlGaN. The barrier layer may include a semiconductor material having the bandgap higher than the bandgap of the well layer.

The second conductive semiconductor layer 315 is formed on the active layer 314. The second conductive semiconductor layer 315 includes a semiconductor doped with second conductive dopants, for example, includes a semiconductor having the composition formula of InxAlyGa1-x-yN ($0 \leq x \leq 1$, $0 \leq y \leq 1$, $0 \leq x+y \leq 1$). In detail, the second conductive semiconductor layer 315 may include one selected from compound semiconductors such as GaN, InN, AlN, InGaN, AlGaN, InAlGaN, AlInN, AlGaAs, GaP, GaAs, GaAsP, and AlGaInP. If the second conductive semiconductor layer 315 is a p type semiconductor layer, the semiconductor conductive dopant includes the p type dopant such as Mg, Zn, Ca, Sr, or Ba.

The second conductive semiconductor layer 315 may include a superlattice structure, and the superlattice structure may include an InGaN/GaN superlattice structure or am AlGaN/GaN superlattice structure. The superlattice structure of the second conductive semiconductor layer 315 abnormally spreads the current, thereby protecting the active layer 314.

In addition, the light emitting structure 310 may have an opposite conductive type. For example, the first conductive semiconductor layer 313 may include a P type semiconductor layer, and the second conductive semiconductor layer 315 may include an N type semiconductor layer. The second conductive semiconductor layer 315 may be disposed thereon with a first conductive semiconductor layer having the polarity opposite to the second conductive type polarity.

The light emitting structure 310 may be realized by using one of an n-p junction structure, a p-n junction structure, an n-p-n junction structure, and a p-n-p junction structure. The "p" represents a p type semiconductor, the "n" represents an n type semiconductor layer, and the "-" represents that the p type semiconductor is directly or indirectly connected to the n type semiconductor. Hereinafter, a case that the uppermost layer of the light emitting structure 310 is the second conductive semiconductor layer 315 will be described for the convenience of explanation.

The first electrode 316 is disposed on the first conductive semiconductor layer 313, and the second electrode 317 having a current spreading layer is disposed on the second conductive semiconductor layer 315. The first and second electrodes 316 and 317 are connected to each other through a wire, or through another connection scheme.

Figure 43:
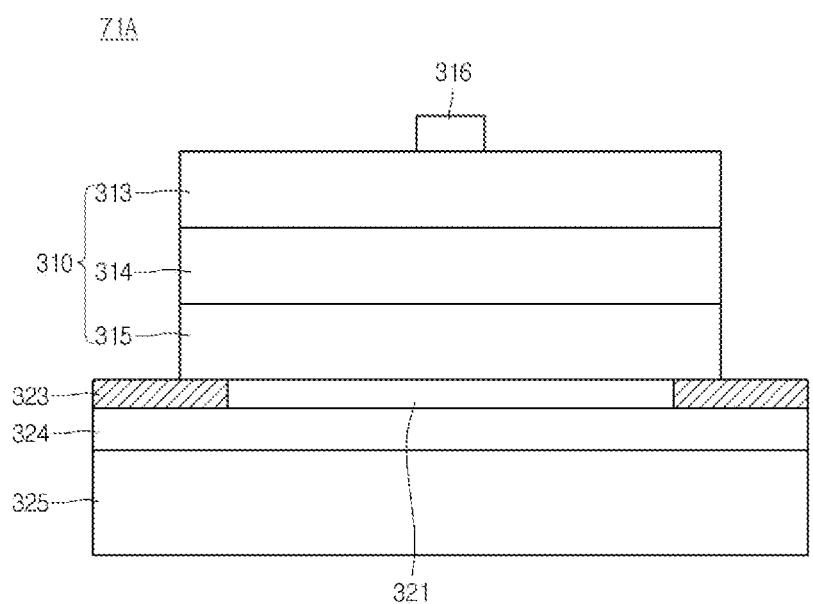
FIG. 43 is a sectional view showing another example of a light emitting chip in a light emitting device according to the embodiment.

FIG. 43 is a graph showing another example of the light emitting chip according to the embodiment. Hereinafter, in the following description of the embodiment, the details of the same parts as that of FIG. 42 will be omitted except for brief description.

Referring to FIG. 43, in a light emitting chip 71A according to the embodiment, a contact layer 321 is formed under a light emitting structure 310, a reflective layer 324 is formed under the contact layer 321, a support member 325 is formed under the reflective layer 324, and a protective layer 323 may be formed around the reflective layer 324 and the light emitting structure 310.

One or a plurality of first electrodes 316 may be formed on the light emitting structure 310, and the first electrode 316 includes a pad bonded to a wire.

The light emitting chip may be formed by removing a growth substrate after forming a contact layer 321, a protective layer 323, a reflective layer 324, and a support member 323 under the second conductive semiconductor layer 315.

The contact layer 321 may make ohmic-contact with a lower layer of the light emitting structure 310, for example, the second conductive semiconductor layer 315, and may include a metallic oxide, a metallic nitride, an insulating material, or a conductive material. For example, the contact layer 321 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 321 may be formed in a multi-layer structure by using a metallic material and a transparent material such as IZO, IZTO, IAZO, IGZO, IGTO, AZO, or ATO. For example, the contact layer 321 may have the stack structure of IZO/Ni, AZO/Ag, IZO/Ag/Ni, or AZO/Ag/Ni. A layer to block current may be further formed in the contact layer 321 corresponding to the electrode 316.

The protective layer 323 may include a metallic oxide or an insulating material. For example, the protective layer 323 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SiO2, SiOx, SiOxNy, Si3N4, Al2O3, or TiO2. The protective layer 323 may be formed through a sputtering scheme or a deposition scheme. The metal constituting the reflective layer 324 may prevent the layers of the light emitting structure 310 from being shorted.

The reflective layer 324 may include metal such as Ag, Ni, Al, Rh, Pd, Ir, Ru, Mg, Zn, Pt, Au, Hf, or the selective combination thereof. The reflective layer 324 may have a width greater than the width of the light emitting structure 310, thereby improving the light reflection efficiency. A metallic layer for bonding and a metallic layer for thermal diffusion may be further disposed between the reflective layer 324 and the support member 325, but the embodiment is not limited thereto.

The support member 325 serves as a base substrate, and may include metal such as Cu, Au, Ni, Mo, or Cu—W, and a carrier wafer, such as Si, Ge, GaAs, ZnO, and SiC. An adhesive layer may be further formed between the support member 325 and the reflective layer 324, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which plurality of light emitting devices are arrayed. The lighting system includes a display apparatus shown in FIGS. 44 and 45, a lighting apparatus shown in FIGS. 46 to 50, a lighting lamp, a camera flash, a signal lamp, a headlamp for a vehicle, and an electronic display.

Figure 44:
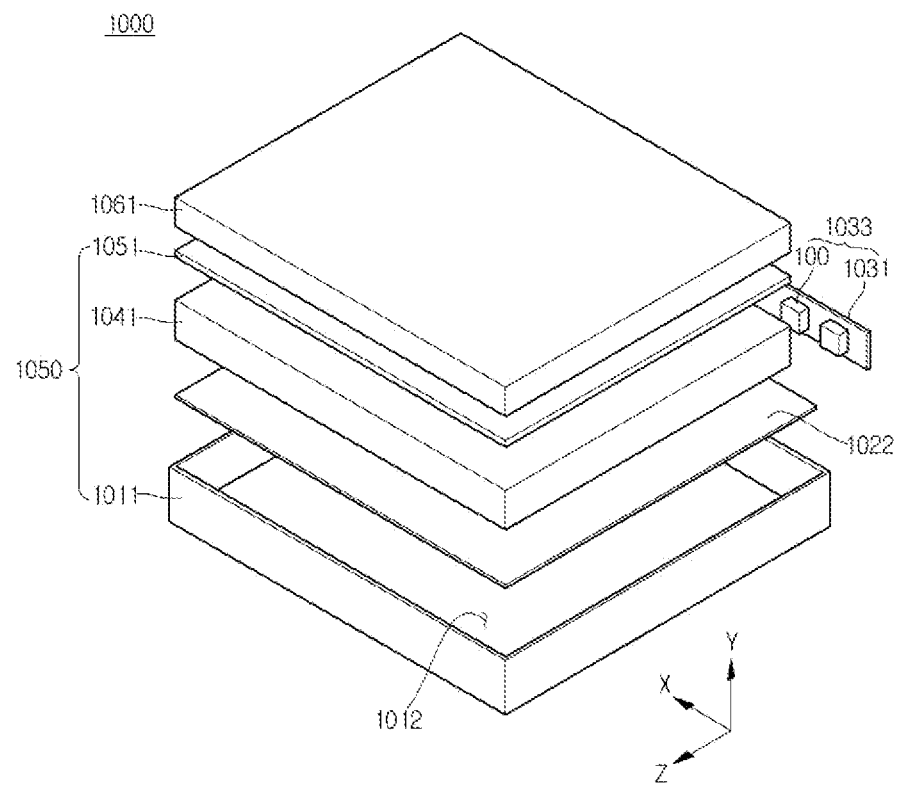
FIG. 44 is a perspective view showing a display apparatus having the light emitting device according to the embodiment.

FIG. 44 is an exploded perspective view showing a display apparatus having the light emitting device according to the embodiment.

Referring to FIG. 44, a display apparatus 1000 according to the embodiment includes a light guide plate 1041, a light source module 1033 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1033, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1033 is disposed on at least one side of the light guide plate 1041 to supply the light to at least one side of the light guide plate 1041. The light source module 1033 serves as the light source of the display device.

At least one light source module 1033 is disposed to directly or indirectly supply the light from one side of the light guide plate 1041. The light source module 1033 may include a board 1031 and the light emitting device according to the embodiments or the light emitting device 100. The light emitting device or the light emitting device 100 are arranged on the board 1031 while being spaced apart from each other at the predetermined interval.

The board 1031 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 100 is installed on the side of the bottom cover 1011 or on a heat dissipation plate, the board 1031 may be omitted. The heat dissipation plate partially makes contact with the top surface of the bottom cover 1011.

In addition, the light emitting device 100 are arranged such that light exit surfaces to discharge light of the light emitting device 100 are spaced apart from the light guide plate 1041 by a predetermined distance on the board 1031, but the embodiment is not limited thereto. The light emitting device 100 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1033, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1033 as optical members, but the embodiment is not limited thereto.

Figure 45:
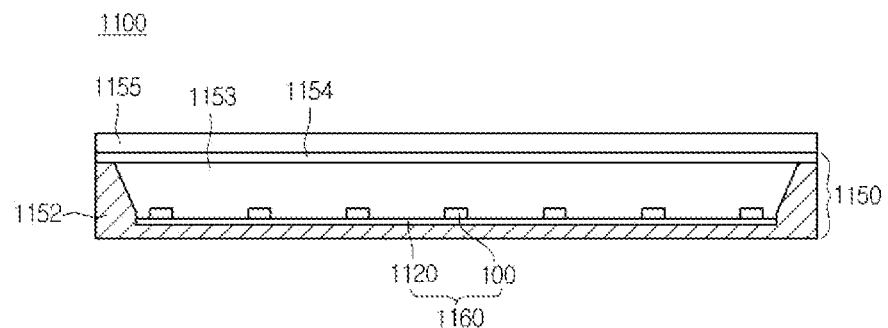
FIG. 45 is a sectional view showing a display apparatus according to the embodiment.

FIG. 45 is a sectional view showing a display apparatus according to the embodiment.

Referring to FIG. 45, the display device 1100 includes a bottom cover 1152, a board 1120 on which the light emitting device 100 are arrayed, an optical member 1154, and a display panel 1155.

The board 1120 and the light emitting device 100 may constitute the light source module 1160. In addition, the bottom cover 1152, at least one light source module 1160, and the optical member 1154 may constitute a light unit 1150. The bottom cover 1152 can be disposed with a receiving section 1153, but the embodiment is not limited thereto. The light source module 1160 includes a board 1120, and a plurality of light emitting devices arranged on the board 1120 or a light emitting device 100.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 46:
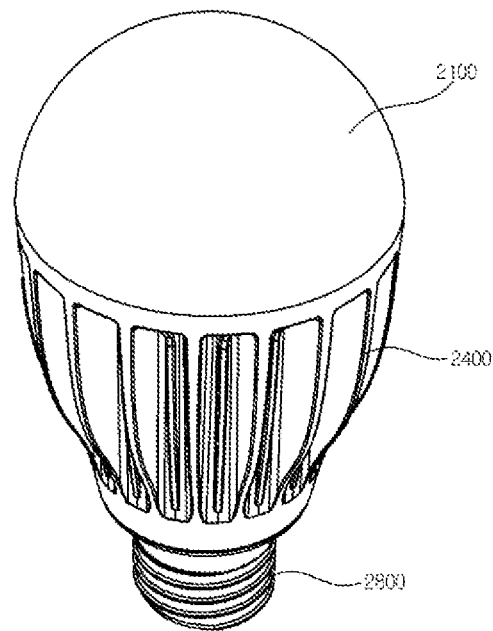
FIGS. 46 to 48 are views showing a lighting apparatus according to the embodiment.
Figure 47:
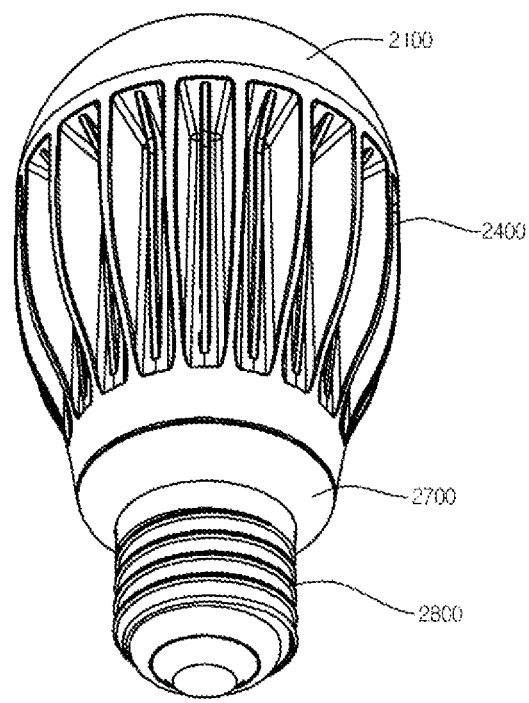
Figure 48:
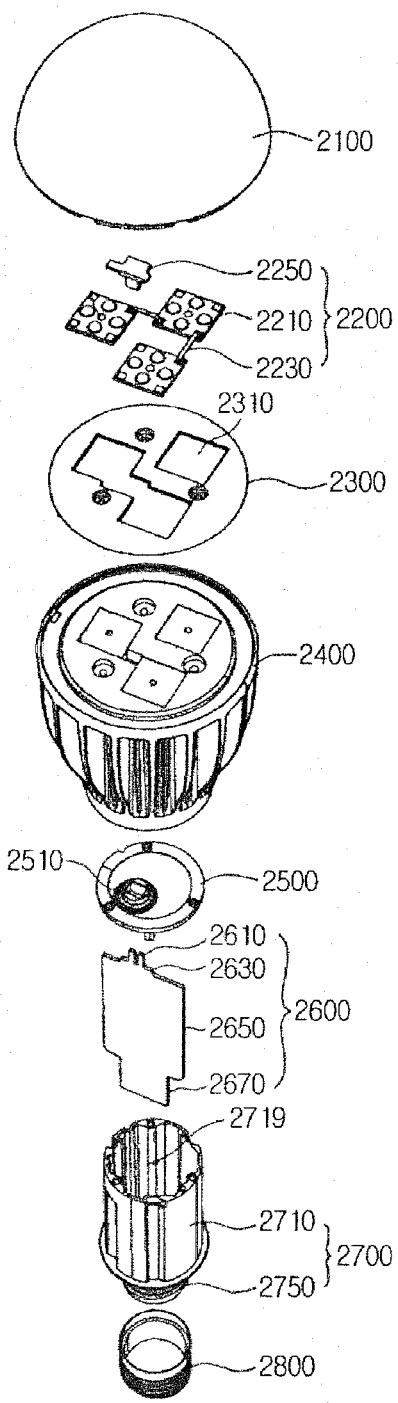

FIGS. 46 to 48 are views showing a lighting apparatus according to the embodiment.

FIG. 46 is a perspective view of the lighting apparatus according to the embodiment when viewed from the top, FIG. 47 is a perspective view of the lighting apparatus depicted in FIG. 46 when viewed from the bottom, and FIG. 48 is an exploded perspective view of the lighting apparatus depicted in FIG. 46.

Referring to FIGS. 46 to 48, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device or the light emitting device package according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

Figure 49:
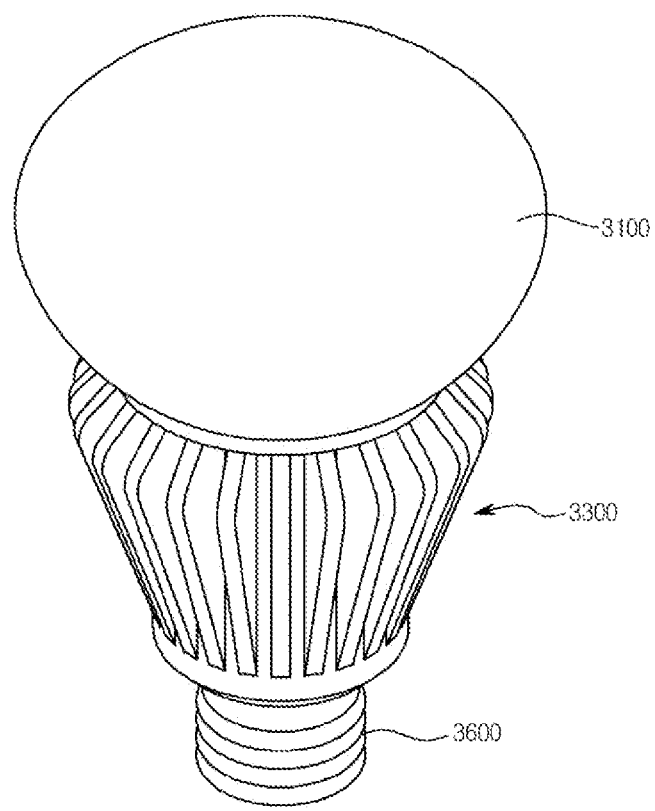
FIGS. 49 and 50 are views showing other examples of a lighting apparatus according to the embodiment.
Figure 50:
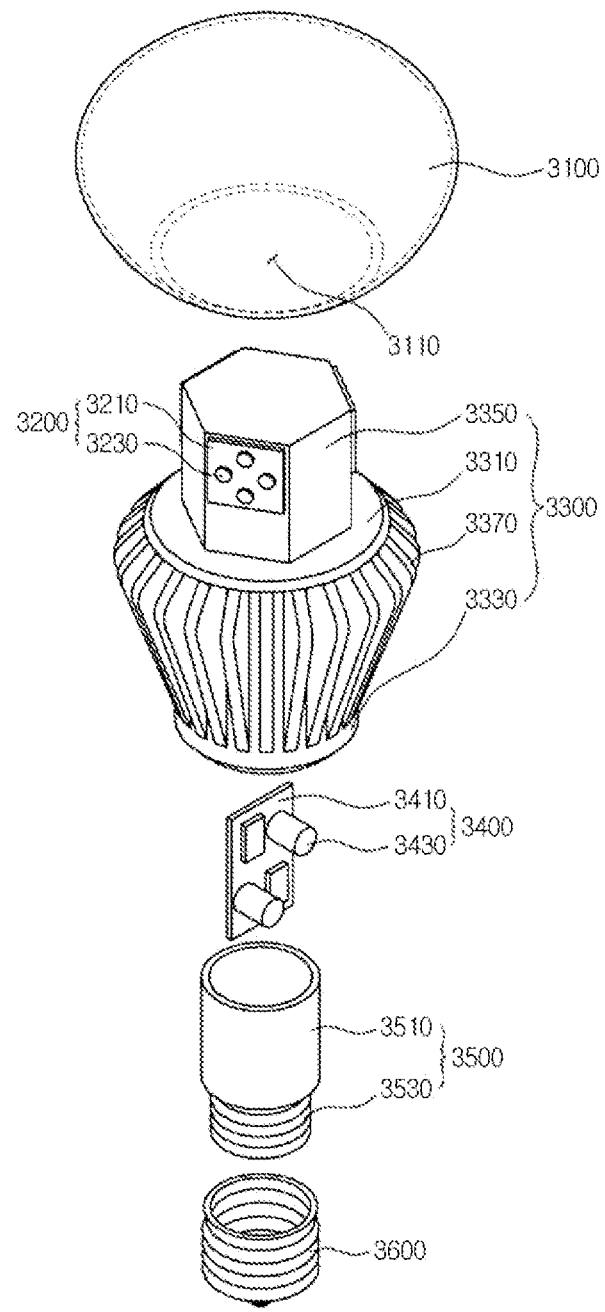

FIGS. 49 and 50 are views showing other examples of a lighting apparatus according to the embodiment.

FIG. 49 is a perspective view showing the lighting apparatus according to the embodiment, and FIG. 50 is an exploded perspective view of the lighting apparatus shown in FIG. 49.

Referring to FIGS. 49 and 50, the lighting apparatus according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 3230 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface 3310 of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. For example, the light source part 3200 is disposed at three of the six lateral sides of the member 3350.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator. The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410. For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400. For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3530.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body including first and second side walls which are opposite to each other, third and fourth side walls which have lengths shorter than lengths of the first and second side walls, and a concave portion therein, wherein the third and fourth side wall are opposite to each other;
a first lead frame under the concave portion and the third side wall;
a second lead frame under the concave portion and the fourth side wall;
a light emitting chip on at least one of the first and second lead frames;
a molding member on the concave portion;
a first recess portion recessed from the first side wall toward the second side wall and connected to a bottom of the body;
a second recess portion recessed from the second side wall toward the first side wall and connected to the bottom of the body, and
a connecting frame disposed on a bottom of the concave portion,
wherein the first recess portion and the second recess portion are recessed from the bottom of the body,
wherein the first lead frame includes a first cavity lower than a bottom of the concave portion and a first lead part protruding more than the third side wall,
the second lead frame includes a second cavity lower than the bottom of the concave portion and a second lead part protruding more than the fourth side wall,
the light emitting chip includes a first light emitting chip disposed in the first cavity and a second light emitting chip disposed in the second cavity,
wherein the connecting frame has a middle connecting terminal that electrically connects the first light emitting chip to the second light emitting chip,
wherein a portion of the body is disposed between the first lead frame and the first recess portion,
wherein a portion of the body is disposed between the second lead frame and the second recess portion, and
wherein the first cavity is spaced apart from the second cavity.

2. The light emitting device of claim 1, wherein the first and second recess portions are opposite to each other with respect to at least one of the first and second cavities.

3. The light emitting device of claim 1, further comprising:
a third recess portion spaced apart from the first recess portion under the first side wall of the body; and
a fourth recess portion spaced apart from the second recess portion under the second side wall of the body,
wherein the first and second recess portions are opposite to each other with respect to the first cavity, and
the third and fourth recess portions are opposite to each other with respect to the second cavity,
wherein the third recess portion and the fourth recess portion are recessed from the bottom of the body.

4. The light emitting device of claim 3, wherein a distance between the first and third recess portions is larger than an interval between bottoms of the first and second cavities.

5. The light emitting device of claim 3, further comprising:
a fifth recess portion connecting the first recess portion to the third recess portion under the first side wall and having a width larger than a width of the first or third recess.

6. The light emitting device of claim 1, wherein a width of at least one of the first and second recess portions is less than an interval between the bottoms of the first and second cavities, and
a depth of at least one of the first and second recess portions is less than a distance between a bottom of the first cavity and the first side wall.

7. The light emitting device of claim 6, wherein at least one of the first and second recess portions has a width larger than an interval between bottoms of the first and second cavities.

8. The light emitting device of claim 1, wherein the first and second side walls are inclined with respect to a bottom of the body, and
the first and second recess portions have a height less than a thickness of the first and second lead frames when measured from the bottom of the body.

9. The light emitting device of claim 1, wherein each of the first and second side walls has an upper region inclined with respect to the bottom of the body and a lower region perpendicular to the bottom of the body, and
the first and second recess portions are recessed from the lower regions of the first and second side walls of the body.

10. The light emitting device of claim 1, wherein the first and second side walls have a length at least two times longer than a length of the third and fourth side walls.

11. The light emitting device of claim 1, wherein at least one of the first and second recess portions includes a convex portion.

12. The light emitting device of claim 1, wherein the first recess portion is disposed corresponding to a side surface of the first cavity,
the second recess portion is disposed corresponding to a side surface of the second cavity, and
wherein the first and second recess portions are overlapped with the bottoms of the first and second cavities in a horizontal direction.

13. The light emitting device of claim 1, the first and second recess portions are disposed corresponding to a gap part between the first and second lead frames.

14. The light emitting device of claim 1, wherein at least one of the first and second recess portions has a depth in a range of 30 μm to 100 μm and a width in a range of 50 μm to 500 μm.

15. A light emitting device comprising:
a body including first and second side walls which correspond to each other, third and fourth side walls which have lengths shorter than lengths of the first and second side walls, and a concave portion therein;
a first lead frame under the concave portion;
a second lead frame under the concave portion;
a first light emitting chip on the first lead frame;
a second light emitting chip on the second lead frame;
a molding member on the concave portion;
a plurality of first recess portions recessed from the first side wall toward the second side wall;
a plurality of second recess portions recessed from the second side wall toward the first side wall, and
a connecting frame disposed on a bottom of the concave portion,
wherein a portion of the body is disposed between the first lead frame and the second lead frame and the plurality of first recess portions,
wherein a portion of the body is disposed between the first lead frame and the second lead frame and the plurality of second recess portions,
wherein the connecting frame has a middle connecting terminal that electrically connects the first light emitting chip to the second light emitting chip, and
wherein the plurality of first recess portions are spaced apart from each other by an interval larger than an interval between the first and second light emitting chips.

16. The light emitting device of claim 15, wherein a length of the first and second side walls is at least three times longer than a length of the third and fourth side walls.

17. The light emitting device of claim 16, wherein the first recess portions and the second recess portions are open from a bottom of the body.

18. The light emitting device of claim 16, further comprising:
a third recess portion connected to the first recess portion.

19. The light emitting device of claim 15, wherein the first recess portions and the second recess portions are recessed toward a top of the body from a bottom of the body.

20. The light emitting device of claim 15, wherein the first lead frame includes a first cavity lower than a bottom of the concave portion and a first lead part protruding more than the third side wall,
the second lead frame includes a second cavity lower than the bottom of the concave portion and a second lead part protruding more than the fourth side wall,
the light emitting chip includes a first light emitting chip disposed in the first cavity and a second light emitting chip disposed in the second cavity, and
wherein the first cavity is spaced apart from the second cavity.

21. The light emitting device of claim 20, wherein a bottom surface of bottom frame of the first cavity is disposed between the first recess portions and a bottom surface of bottom frame of the second cavity is disposed between the second recess portions.

* * * * *